(12) United States Patent
Clark et al.

(10) Patent No.: US 11,820,582 B2
(45) Date of Patent: Nov. 21, 2023

(54) PUFFER DEVICE

(71) Applicant: Suterra, LLC, Los Angeles, CA (US)

(72) Inventors: Zachary Clark, Bend, OR (US); Scott Lindbloom, Bend, OR (US); Daniel Senatore, San Francisco, CA (US)

(73) Assignee: Suterra, LLC, Los Angeles, CA (US)

( * ) Notice: Subject to any disclaimer, the term of this patent is extended or adjusted under 35 U.S.C. 154(b) by 82 days.

(21) Appl. No.: 17/397,080

(22) Filed: Aug. 9, 2021

(65) Prior Publication Data
US 2021/0362940 A1   Nov. 25, 2021

Related U.S. Application Data

(63) Continuation of application No. 16/781,368, filed on Feb. 4, 2020, now Pat. No. 11,117,734.

(60) Provisional application No. 62/828,636, filed on Apr. 3, 2019.

(51) Int. Cl.
| | | |
|---|---|---|
| *B65D 83/20* | (2006.01) | |
| *A01G 7/06* | (2006.01) | |
| *A01M 29/12* | (2011.01) | |
| *H05K 1/18* | (2006.01) | |
| *H05K 7/14* | (2006.01) | |

(Continued)

(52) U.S. Cl.
CPC .............. *B65D 83/205* (2013.01); *A01G 7/06* (2013.01); *A01M 29/12* (2013.01); *H05K 1/181* (2013.01); *H05K 7/1427* (2013.01); *B65D 83/262* (2013.01); *B65D 83/384* (2013.01); *H05K 2201/10083* (2013.01)

(58) Field of Classification Search
CPC .. B65D 83/205; B65D 83/262; B65D 83/384; A01G 7/06; A01M 29/12; H05K 1/181; H05K 7/1427; H05K 2201/10083
See application file for complete search history.

(56) References Cited

U.S. PATENT DOCUMENTS

| | | |
|---|---|---|
| 3,584,766 A | 6/1971 | Hart |
| 3,710,985 A | 1/1973 | Baum |
| 3,732,509 A | 5/1973 | Florant et al. |
| (Continued) | | |

FOREIGN PATENT DOCUMENTS

| | | |
|---|---|---|
| CN | 2146310 Y | 11/1993 |
| CN | 101111449 A | 1/2008 |
| (Continued) | | |

OTHER PUBLICATIONS

International Search Report and Written Opinion for Application No. PCT/US2020/016524 dated Jun. 16, 2020 (16 pages)
(Continued)

*Primary Examiner* — Frederick C Nicolas
(74) *Attorney, Agent, or Firm* — Michael Best & Friedrich LLP

(57) ABSTRACT

A puffer device includes a cabinet having a printed circuit board and a gear train assembly coupled to the printed circuit board. The gear train assembly includes a motor and a gear driven by the motor. A cam is coupled to the gear. The cabinet further includes a plunger configured to be contacted and driven by the cam. The puffer device further includes an aerosol can assembly configured to be releasably coupled to the cabinet, wherein movement of the plunger is configured to dispense a material from the aerosol can assembly.

24 Claims, 27 Drawing Sheets

(51) Int. Cl.
    *B65D 83/26*    (2006.01)
    *B65D 83/38*    (2006.01)

(56) References Cited

U.S. PATENT DOCUMENTS

| | | | |
|---|---|---|---|
| 3,739,944 A | | 6/1973 | Rogerson |
| 3,997,083 A | | 12/1976 | McNair |
| 4,063,664 A | | 12/1977 | Meetze, Jr. |
| 4,235,373 A | | 11/1980 | Clark |
| 5,249,718 A | | 10/1993 | Muderlak |
| 5,358,147 A | | 10/1994 | Adams et al. |
| 6,293,442 B1 | | 9/2001 | Mollayan |
| 7,637,394 B2 | * | 12/2009 | Grant .................. B65D 83/205 222/321.9 |
| 7,651,009 B2 | * | 1/2010 | Grant .................. B05B 11/0038 222/402.13 |
| 8,261,946 B2 | * | 9/2012 | Grant .................. B05B 11/3052 222/321.9 |
| 8,453,883 B2 | * | 6/2013 | Habermann ............... F41H 9/10 222/402.11 |
| 9,894,852 B2 | | 2/2018 | Gilbert et al. |
| 11,117,734 B2 | * | 9/2021 | Clark .................. B65D 83/205 |
| 2005/0067439 A1 | | 3/2005 | Furner et al. |
| 2007/0102456 A1 | | 5/2007 | Tsay |
| 2009/0032618 A1 | | 2/2009 | Hornsby et al. |
| 2009/0045219 A1 | | 2/2009 | Helf et al. |
| 2010/0078541 A1 | | 4/2010 | Fathi et al. |
| 2010/0163573 A1 | | 7/2010 | Wegelin et al. |
| 2010/0237103 A1 | | 9/2010 | Habermann et al. |
| 2014/0069956 A1 | | 3/2014 | Baranowski et al. |
| 2014/0263426 A1 | | 9/2014 | Gasper |
| 2015/0083755 A1 | | 3/2015 | Mecker et al. |
| 2015/0306268 A1 | | 10/2015 | Torres |
| 2017/0326563 A1 | | 11/2017 | Johnson et al. |

FOREIGN PATENT DOCUMENTS

| | | |
|---|---|---|
| CN | 106163579 A | 11/2016 |
| CN | 206009098 U | 3/2017 |
| GB | 1484010 A | 8/1977 |
| GB | 2443960 A | 5/2008 |
| WO | 2009151213 A1 | 12/2009 |

OTHER PUBLICATIONS

Chinese Patent Office First Office Action and Search Report for Application No. 202080026728.5 dated Mar. 21, 2022 (8 pages including statement of relevance).

European Patent Office Partial Supplementary Search Report for Application No. 20782871.6 dated Nov. 15, 2022 (13 pages).

European Patent Office Action for Related Application No. 20782871.6 dated Feb. 15, 2023 (11 pages).

* cited by examiner

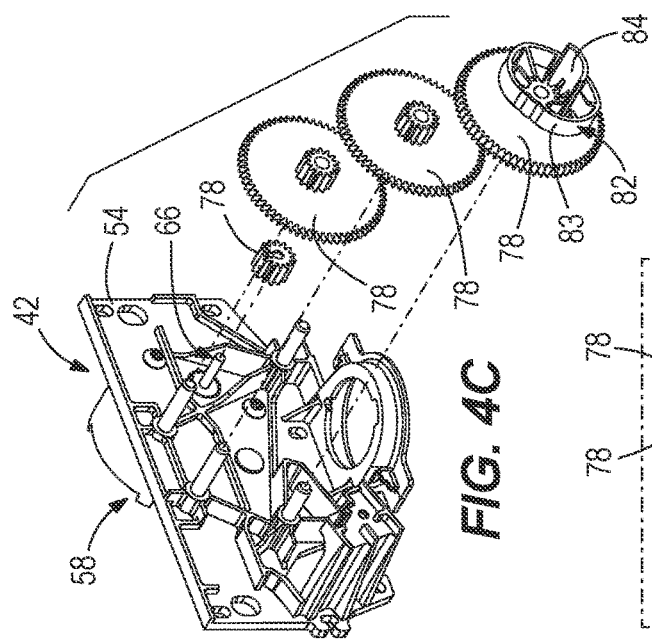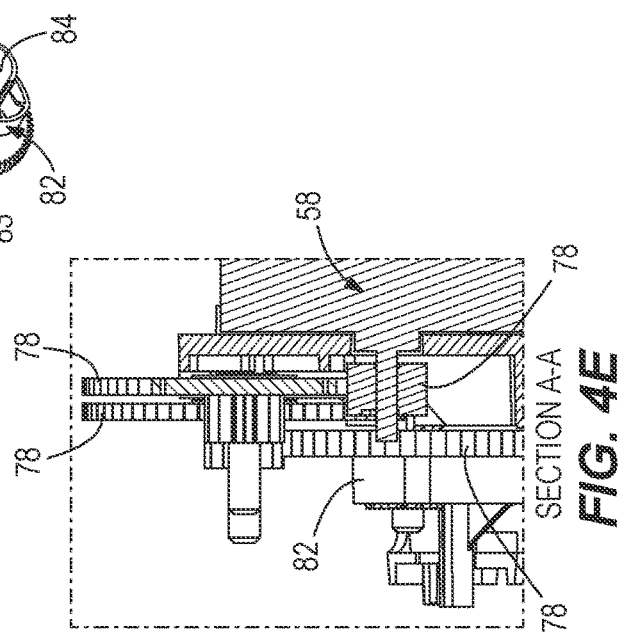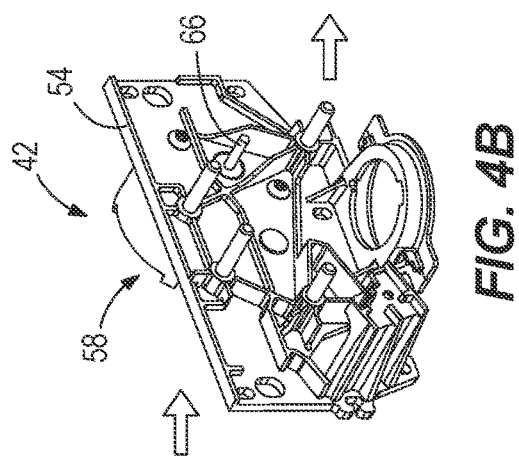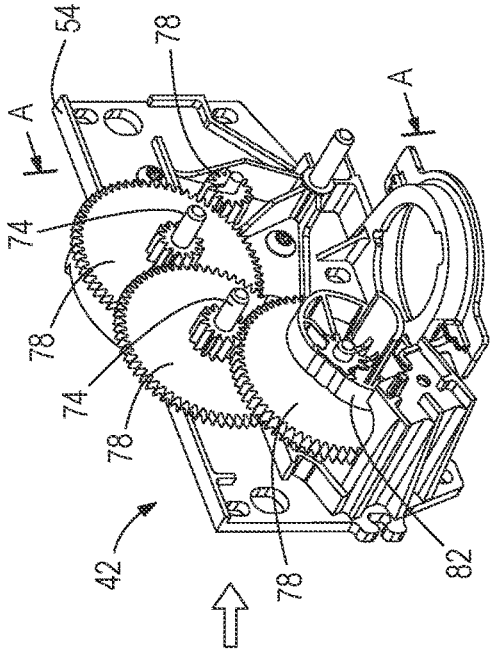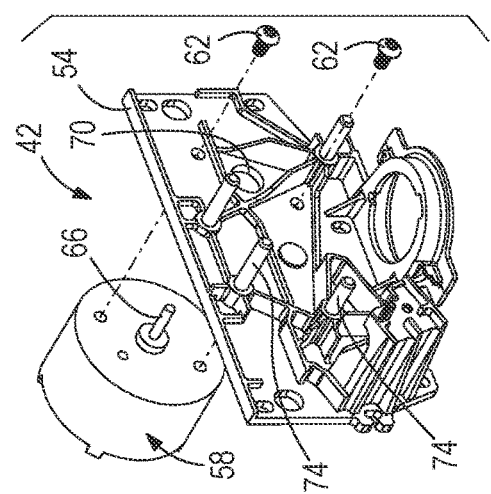

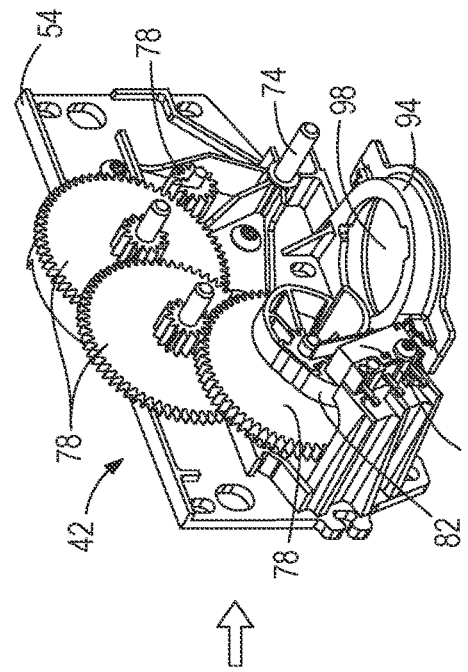
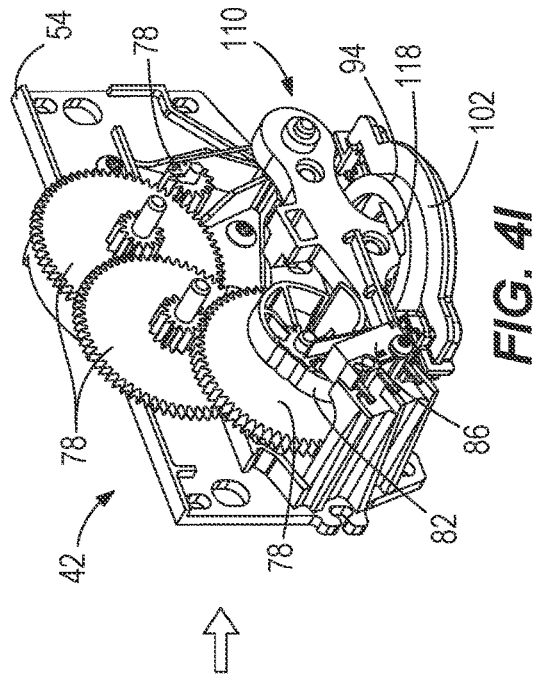
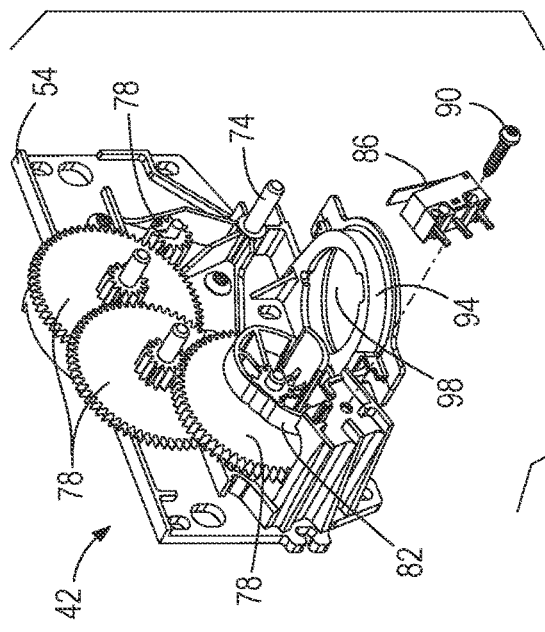
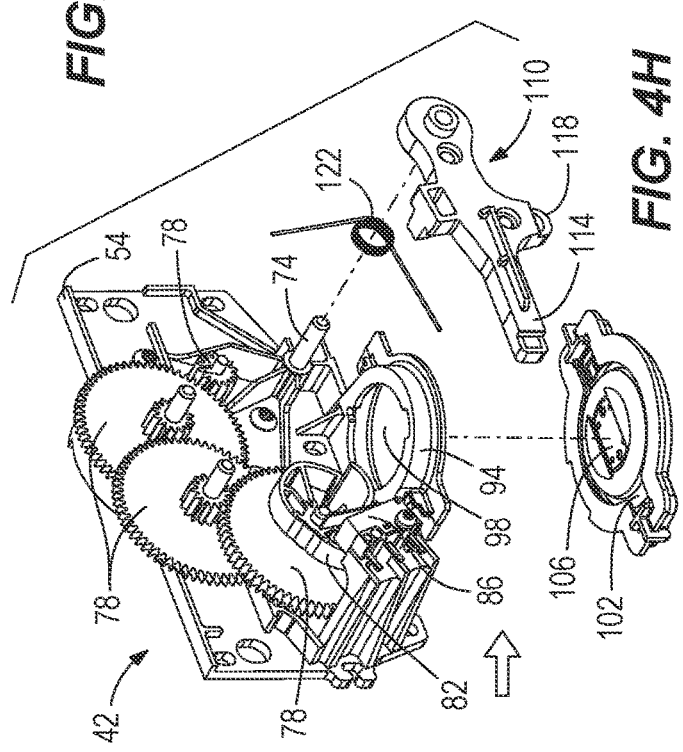

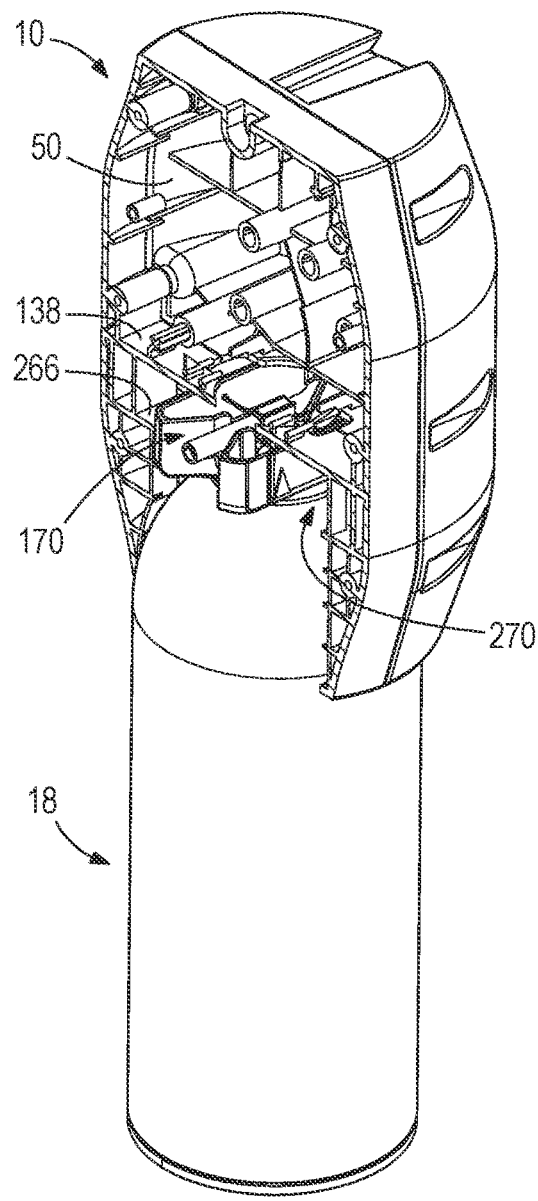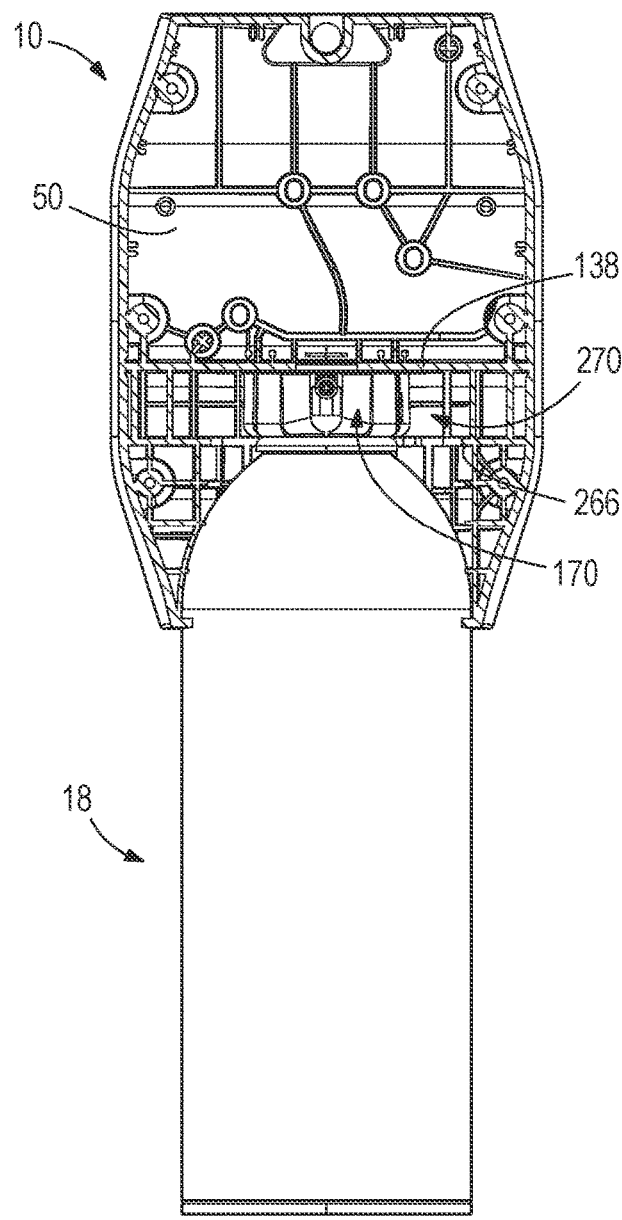
*FIG. 27*  *FIG. 28*

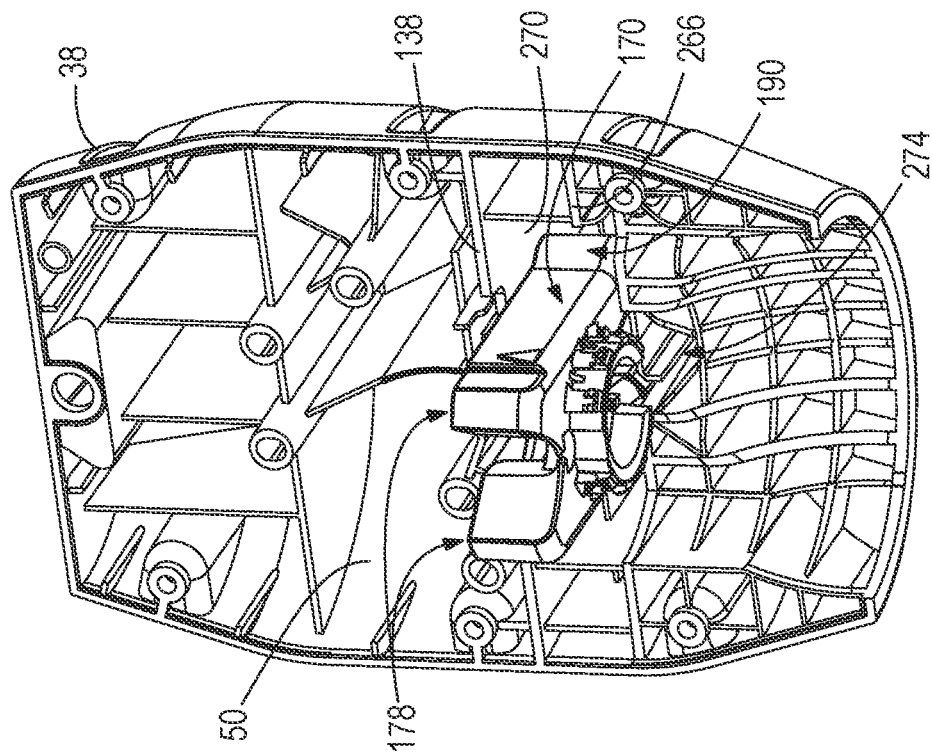
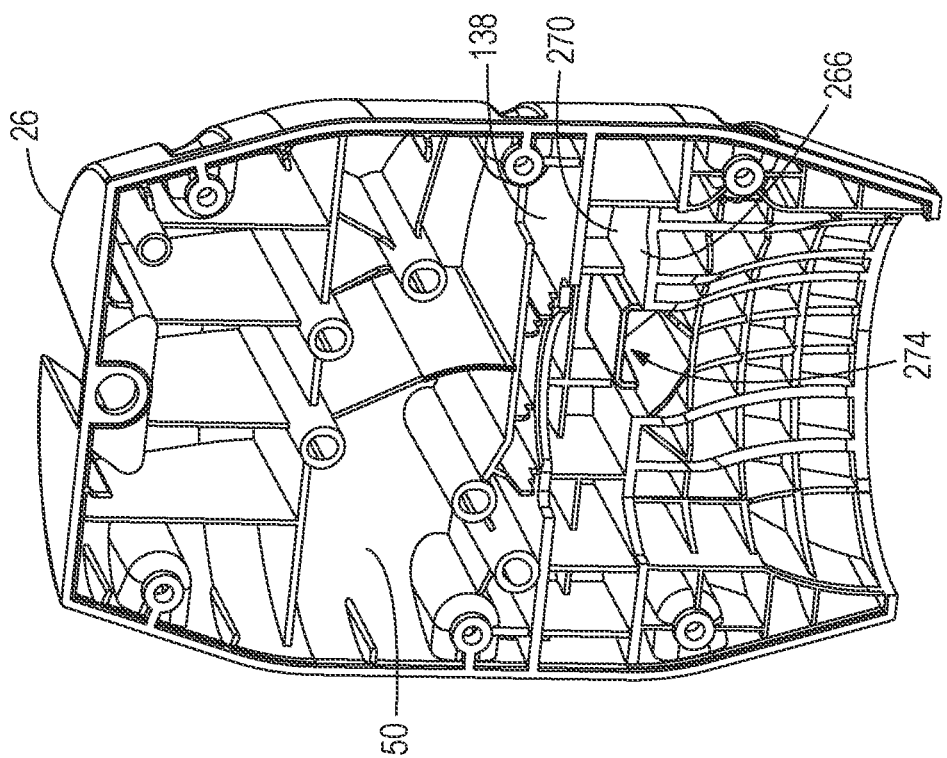

PUFFER DEVICE

CROSS-REFERENCE TO RELATED APPLICATION(S)

This application is a continuation of U.S. application Ser. No. 16/781,368, filed Feb. 4, 2020, and claims priority to U.S. Provisional Application No. 62/828,636, filed Apr. 3, 2019, the entire contents of each of which are incorporated herein by reference.

FIELD OF THE INVENTION

The present invention relates to puffer devices, including puffer devices for dispensing pheromones in a commercial agricultural environment.

In commercial agricultural environments, such as orchards, puffer devices are commonly employed for pest control. Puffer devices are generally programmable to be operational within a wide variety of operating modes, such as starting and ending operations at specific times during the day, and include both a housing a spray mechanism inside the housing that sprays the pheromones out from the housing onto plants in the orchard to reduce pest populations.

SUMMARY

In accordance with one embodiment, a puffer device includes a cabinet having a printed circuit board and a gear train assembly coupled to the printed circuit board. The gear train assembly includes a motor and a gear driven by the motor. A cam is coupled to the gear. The cabinet further includes a plunger configured to be contacted and driven by the cam. The puffer device further includes an aerosol can assembly configured to be releasably coupled to the cabinet, wherein movement of the plunger is configured to dispense a material from the aerosol can assembly.

In accordance with another embodiment, a puffer device includes a cabinet having a sealed upper chamber. The cabinet includes a printed circuit board and a gear train assembly coupled to the printed circuit board. The printed circuit board and the gear train assembly are each disposed within the sealed upper chamber. The gear train assembly includes a motor and a gear driven by the motor. The cabinet further includes a plunger disposed within the sealed upper chamber and driven by the motor. The puffer device further includes an aerosol can assembly configured to be releasably coupled to the cabinet in an area of the cabinet outside of the sealed upper chamber. Movement of the plunger is configured to dispense a material from the aerosol can assembly.

In accordance with another embodiment, a puffer device includes a cabinet having a printed circuit board and a gear train assembly coupled to the printed circuit board. The gear train assembly includes a motor and a gear driven by the motor. The cabinet further includes a plunger driven by the motor. The puffer device further includes an aerosol can assembly. Movement of the plunger is configured to dispense a material from the aerosol can assembly. The aerosol can assembly includes an aerosol can, an adapter coupled to the aerosol can, and a lock coupled to the adapter. The aerosol can assembly is configured to be releasably coupled to the cabinet by a rotation of the adapter within the cabinet.

In accordance with another embodiment, a puffer device includes a cabinet having a housing. The housing includes a keyed region along an exterior of the housing. The puffer device further includes a hanging device configured to be coupled to the keyed region, and an aerosol can assembly configured to be releasably coupled to the cabinet.

Other aspects of the invention will become apparent by consideration of the detailed description and accompanying drawings.

BRIEF DESCRIPTION OF THE DRAWINGS

FIGS. 4A-4I are perspective views of the gear train assembly, illustrating steps of assembling the gear train assembly.

FIGS. 27 and 28 are cross-sectional views of the puffer device, illustrating the aerosol can assembly in a rotated, second installation position within the cabinet.

FIG. 29 is a perspective view of the rear enclosure, illustrating a locking tab.

FIG. 30 is a perspective view of the rear enclosure, illustrating the adapter coupled to the locking tab.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limited.

DETAILED DESCRIPTION

Figure 1:
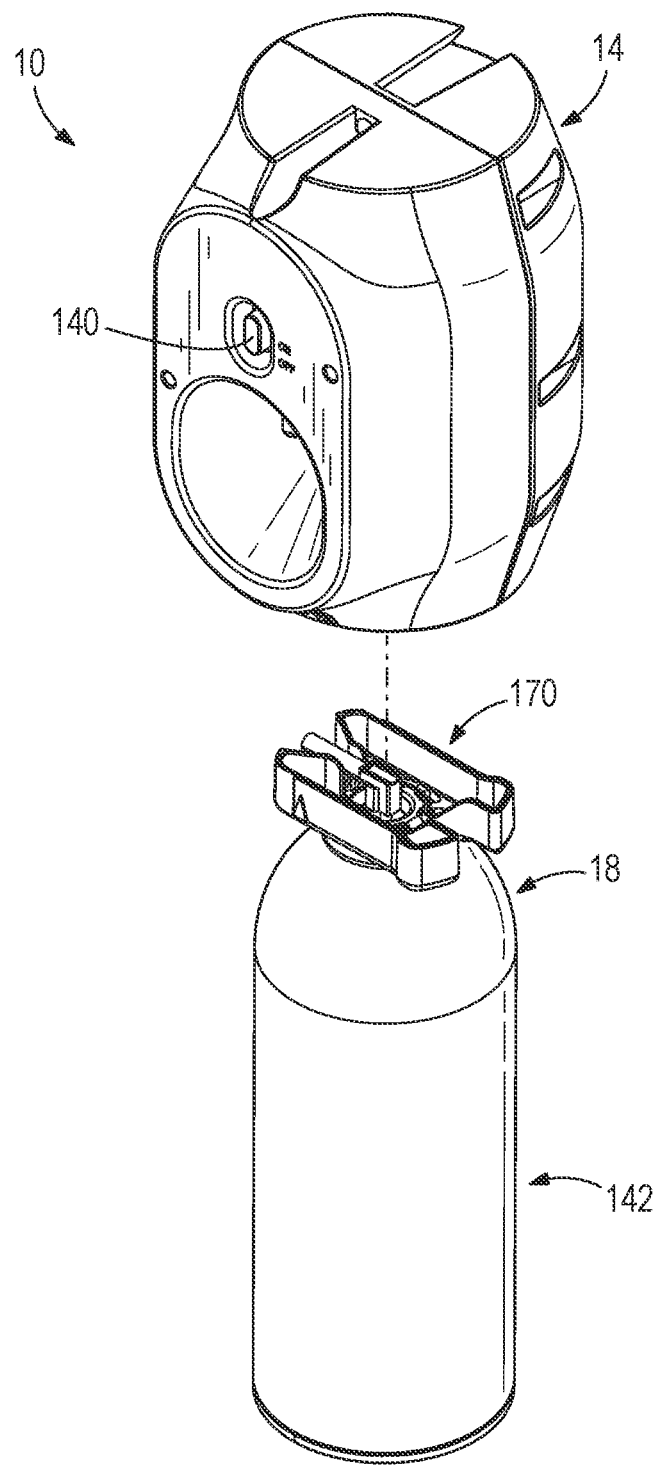
FIG. 1 is a perspective, exploded view of a puffer device according to one embodiment, illustrating a cabinet and an aerosol can assembly.

FIG. 1 illustrates a puffer device 10. The puffer device 10 may be used for example to dispense pheromones in a commercial agricultural environment, such as an orchard. In other embodiments the puffer device 10 may be used to dispense pheromones, or other liquids or gases, in various other environments including non-agricultural environments. As illustrated in FIG. 1, the puffer device 10 generally includes a cabinet 14 and an aerosol can assembly 18 that releasably couples to the cabinet 14.

Figure 2:
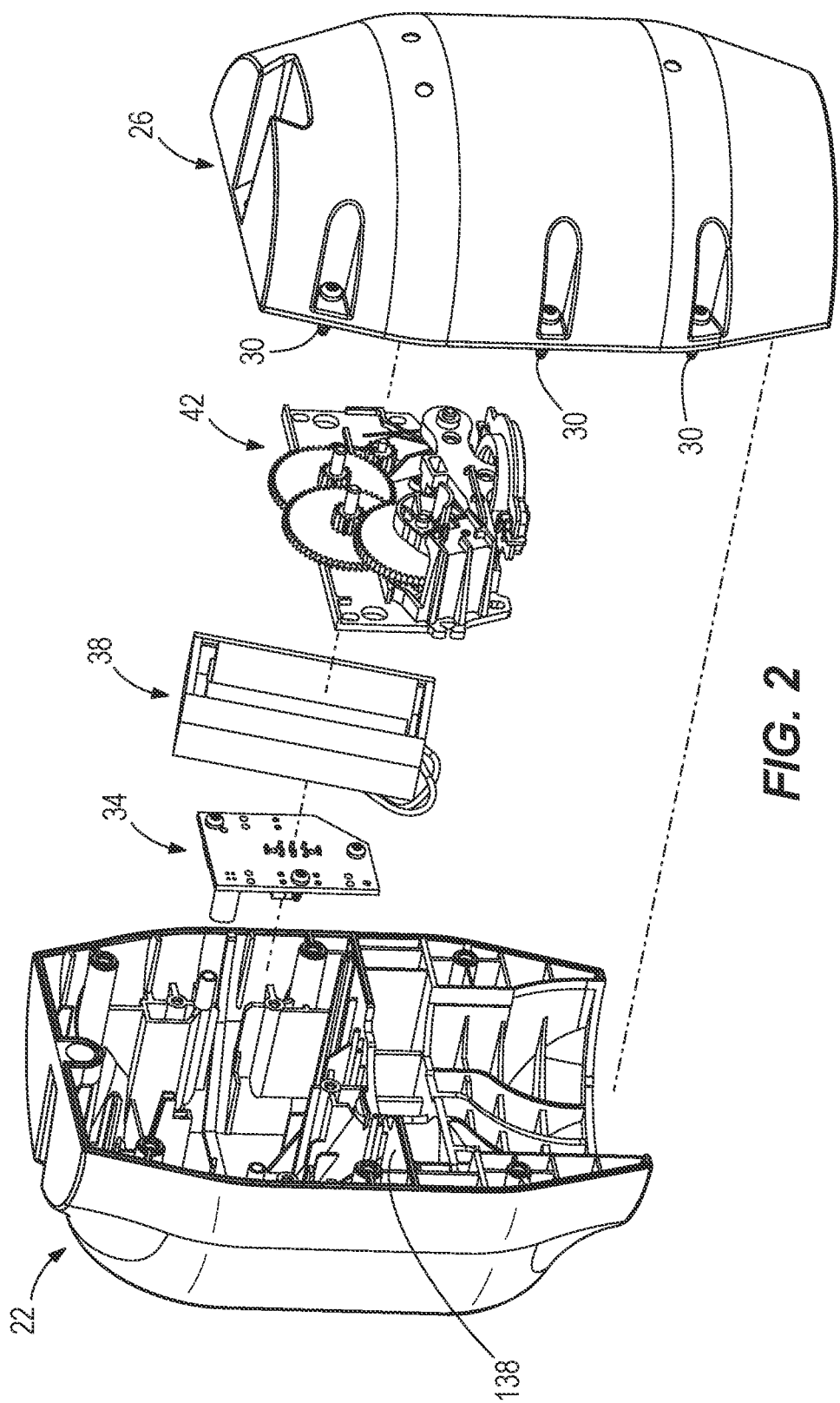
FIG. 2 is a perspective, exploded view of the cabinet, illustrating front and rear enclosures, a printed circuit board, a battery holder, and a gear train assembly.
Figure 3A:
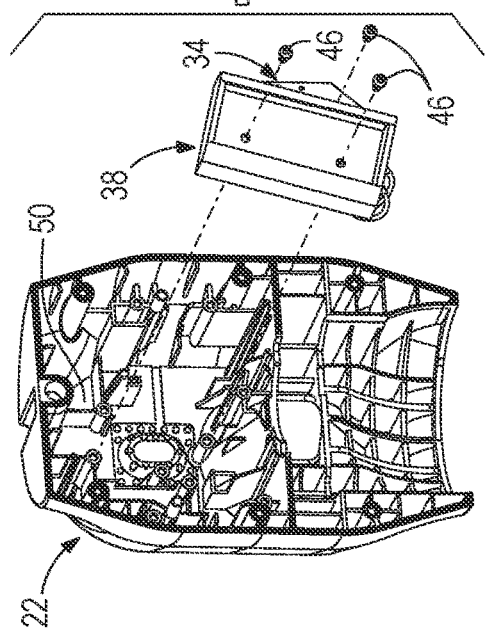
FIGS. 3A-3F are perspective views of the cabinet, illustrating steps of assembling the printed circuit board and the battery holder into the front enclosure.
Figure 3B:
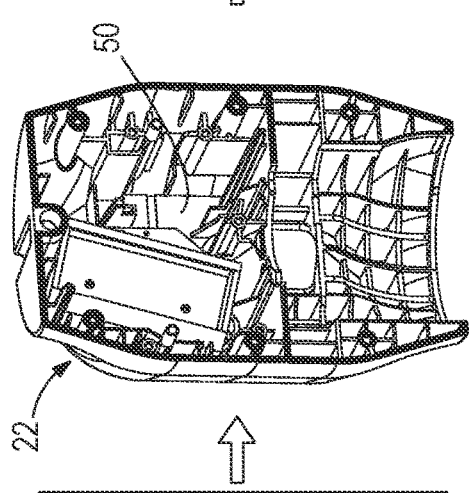
Figure 3C:
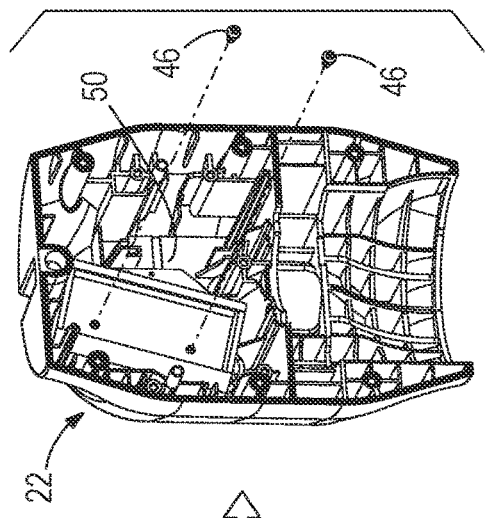
Figure 3D:
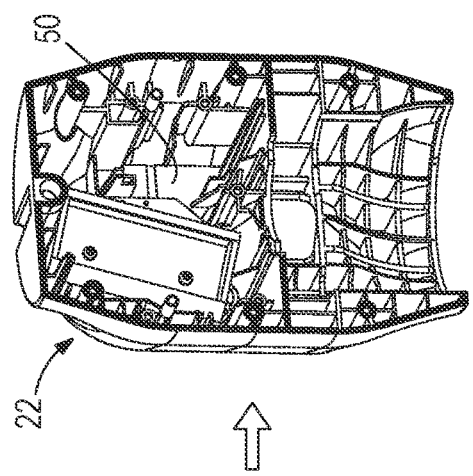
Figure 3E:
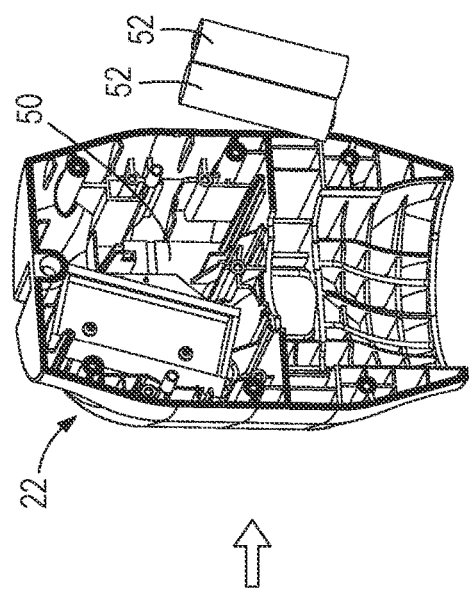
Figure 3F:
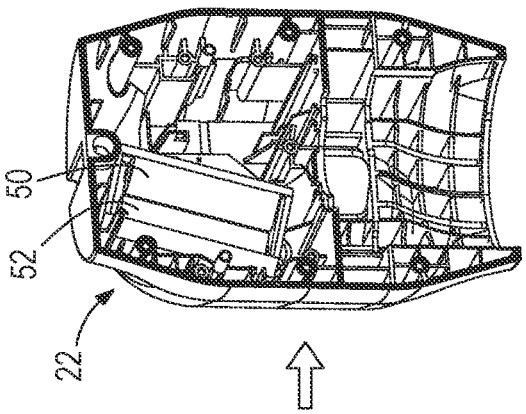

With reference to FIG. 2, in the illustrated embodiment the cabinet 14 includes a front enclosure 22 and a rear enclosure 26 coupled to the front enclosure 22. The front and rear enclosures 22, 26 together define an overall housing for the cabinet 14, and may be made, for example of plastic or other suitable material. In some embodiments, the front and rear enclosures 22, 26 are fastened or otherwise coupled together with one or more fasteners 30. In other embodiments, the front and rear enclosures 22, 26 may be fastened or otherwise coupled together through the use of ultrasonic welding, or other methods that do not require fasteners. In the illustrated embodiment the front and rear enclosures 22, 26 are generally two equally shaped shells that fit together to enclose an interior of the cabinet 14. However, other embodiments may include different numbers and shapes of front and/or rear enclosures than that illustrated. In some embodiments, the front enclosure 22 and/or the rear enclosure 26 may include ribs, flanges, or other structures that add structural integrity and rigidity to the cabinet 14.

With continued reference to FIG. 2, the cabinet 14 further includes a printed circuit board 34 disposed within the interior of the cabinet 14. The printed circuit board 34 may include for example a sensor(s), a microcontroller(s) and/or other control device(s) for controlling operation of the puffer device 10. The cabinet 14 further includes a battery holder 38 for holding one or more batteries, as well as a gear train assembly 42 for receiving commands from the printed circuit board 34 and causing a dispensing of pheromones from the aerosol can assembly 18. The printed circuit board 34, the battery holder 38, and the gear train assembly 42 together fit within the interior of the cabinet 14.

With reference to FIGS. 3A-3F, the printed circuit board 34 and the battery holder 38 may be soldered or otherwise coupled together. The combined printed circuit board 34 and the battery holder 38 may be coupled to an interior of the front enclosure 22. For example, fasteners 46 such as screws may be used to fasten the printed circuit board 34 and the battery holder 38 in place within an upper chamber 50 defined in part by the front enclosure 22. One or more batteries 52 may additionally be installed within the battery holder 38.

With reference to FIGS. 4A-4I, in the illustrated embodiment the gear train assembly 42 includes a gear plate 54 and a motor 58 coupled to the gear plate 54 for example with fasteners 62 (e.g., screws). The motor 58 is coupled to a first side of the gear plate 54, and includes a driven motor shaft 66 that extends through an aperture 70 in the gear plate 54 to a second side of the gear plate 54. The gear plate 54 further includes bearing projections 74 on the second side of the gear plate 54 that each receive a gear 78 (e.g., a toothed gear). During assembly the bearing projections 74 may be pins (e.g., with knurled ends) that are inserted into the gear plate 54 and held in place. In the illustrated embodiment, an additional gear 78 is coupled to driven motor shaft 66. With reference to FIGS. 4A-4E, the motor 58 may be coupled to the first side of the gear plate 54 and the gears 78 may be coupled to the driven motor shaft 66 and the bearing projections 74 such that rotation of the driven motor shaft 66 causes rotation of each of the gears 78 (e.g., creates a gear reduction). Other embodiments include various other numbers and sizes and arrangements of gears than that illustrated, as well as different types of gears than that illustrated. With continued reference to FIGS. 4A-4E, in the illustrated embodiment a cam 82 is coupled to and rotates with one of the gears 78. In some embodiments the cam 82 is formed integrally as a single piece with the gear 78. As illustrated in FIG. 4C, the cam 82 includes both a larger cam portion 83 and a smaller cam portion 84. As described further herein, the cam 82 is used to control and dispense pheromones from the aerosol can assembly 18.

In some embodiments, during assembly the gear plate 54 may be a freely floating plate that may be moved vertically up and down within the cabinet 14 (e.g., within guides defined by the front enclosure 22 and/or rear enclosure 26). Heat stakes may then be used to secure the gear plate 54 in place.

With reference to FIGS. 4F-4I, the gear train assembly 42 further includes a switch 86 (e.g., push-activated switch). In the illustrated embodiment, the switch 86 is coupled to the gear plate 54 with at least one fastener 90, although in other embodiments the switch 86 may be coupled to the gear plate through methods other than the use of fasteners. As described further herein, the smaller cam portion 84 is positioned to contact and activate the switch 86 during use of the puffer device 10.

With continued reference to FIGS. 4F-4I, the gear plate 54 further includes a frame member 94 that extends from the second side of the gear plate 54 (e.g., in a direction generally parallel to the bearing projections 74). In the illustrated embodiment the frame member 94 is a solid, circular frame member defining a central aperture 98. As illustrated in FIGS. 4H and 4I, the gear train assembly 42 further includes a boot 102 (e.g., a disk-like or other-shaped solid structure) and a pressing region 106 coupled to the boot 102. The boot 102 and pressing region 106 are coupled to the frame member 94 (e.g., along a bottom of the frame member 94).

The pressing region 106 may be made for example of plastic, or an elastomeric material, or other material, and as illustrated in FIG. 4H may be exposed through the central aperture 98. In some embodiments the pressing region 106 is formed integrally as a single piece with the boot 102. In other embodiments the pressing region 106 is a separate member coupled to the boot 102.

With continued reference to FIGS. 4F-4I, the gear train assembly 42 further includes a plunger 110 having a plunger arm 114 and a projection 118 extending from the plunger arm 114. In some embodiments, the plunger 110 is a plastic or metal element that is overmolded with an elastic material. With reference to FIGS. 4H and 4I, in the illustrated embodiment one end of the plunger arm 114 is coupled to one of the bearing projections 74 on the second side of the gear plate 54, such that the plunger arm 114 is rotatably coupled to the bearing projection 74 and may pivot generally along a plane that is perpendicular to a rotational axis defined by the bearing projection 74. Pivoting rotation of the plunger arm 114 in a downward motion causes the projection 118 to push down through the central aperture 98 and against the pressing region 106, whereas pivoting rotation of the plunger arm 114 in an upward motion causes the projection 118 to rise up out of the central aperture 98 and be spaced away from the pressing region 106. As described further herein, the pivoting motion of the plunger 110 is controlled by the larger cam portion 83, such that when the plunger 110 is pivoted downwardly, the projection 118 pushes against the pressing region 106 and also against the aerosol can assembly 18 (e.g., against a nozzle of the aerosol can assembly 18), causing the puffer device 10 to dispense pheromones.

Figure 4J:
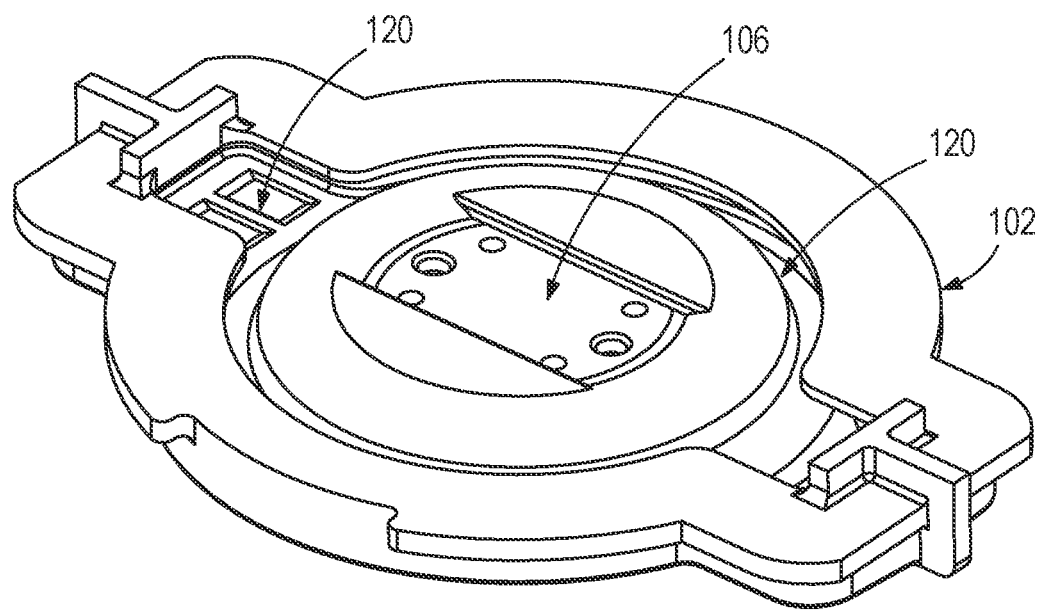
FIGS. 4J and 4K are perspective and cross-sectional views, respectively, of a boot that is coupled to the gear train assembly.
Figure 4K:
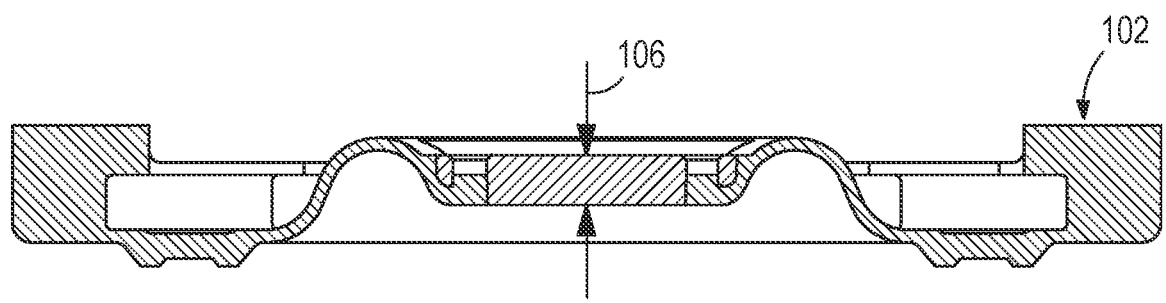

With reference to FIGS. 4J and 4K, in some embodiments the boot 102 is made partially or entirely of a soft material (e.g., elastomeric material), whereas the pressing region 106 (e.g., a small plate) is made partially or entirely of a harder material (e.g., polycarbonate). When the plunger 110 presses down, it may contact the harder material of the pressing region 106 and push this material, or layer of material, down until it contacts the aerosol can assembly 18 to cause the puffer device 10 to dispense the pheromones. In other embodiments, the boot 102 may be made partially or entirely of a hard material, and the pressing region 106 may be made of a softer material. With continued reference to FIG. 4J, the boot 102 may include recessed regions or channels 120 that are sized and shaped to allow the frame member 94 to fit partially within the boot 102, and/or allow the frame member 94 to shift slights within the boot 102 while still maintaining a sealed upper chamber as described below.

With continued reference to FIGS. 4H and 4I, the gear train assembly 42 further includes a biasing element 122 (e.g., torsion spring) that is coupled to both the gear plate 54 and to the plunger arm 114, such that the plunger arm is 114 is naturally biased in one direction (e.g., upwardly). In the illustrated embodiment the biasing element 122 extends around the same bearing projection 74 upon which the plunger arm 114 is connected. Other embodiments include various other types of biasing elements 122 than that illustrated (e.g., tension springs, compression springs, etc.), as well as different locations for the biasing elements 122 than that illustrated.

Figure 5A:
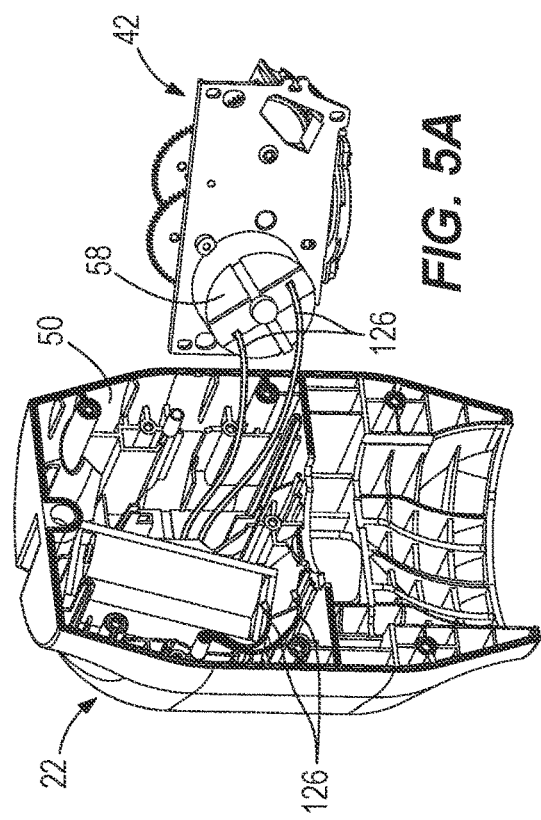
FIGS. 5A-5F are perspective views of the cabinet, illustrating steps of assembling the gear train assembly into the front enclosure, and fastening the front and rear enclosures together.
Figure 5D:
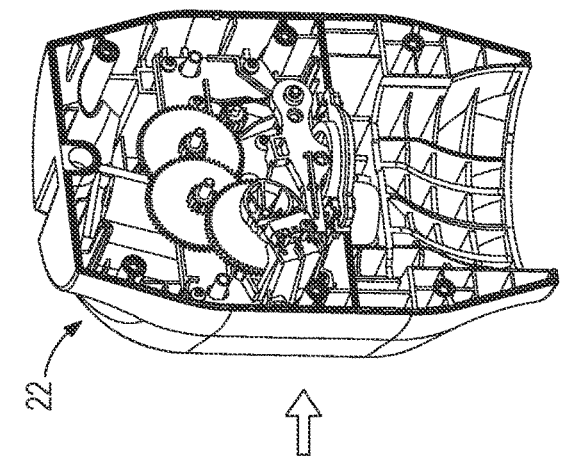
Figure 5C:
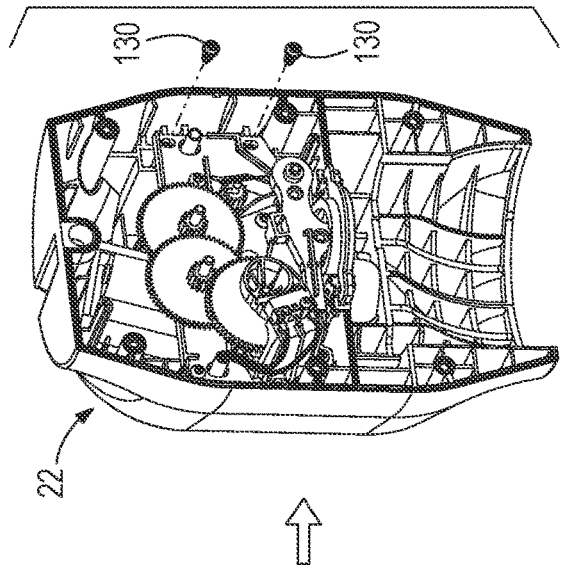
Figure 5B:
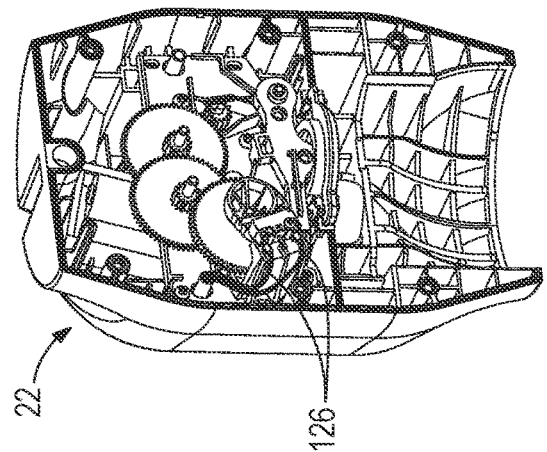
Figure 5F:
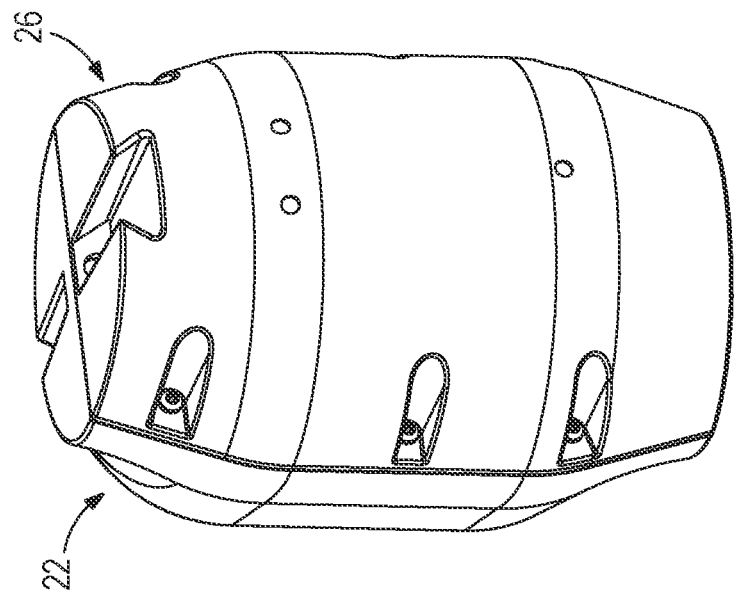
Figure 5E:
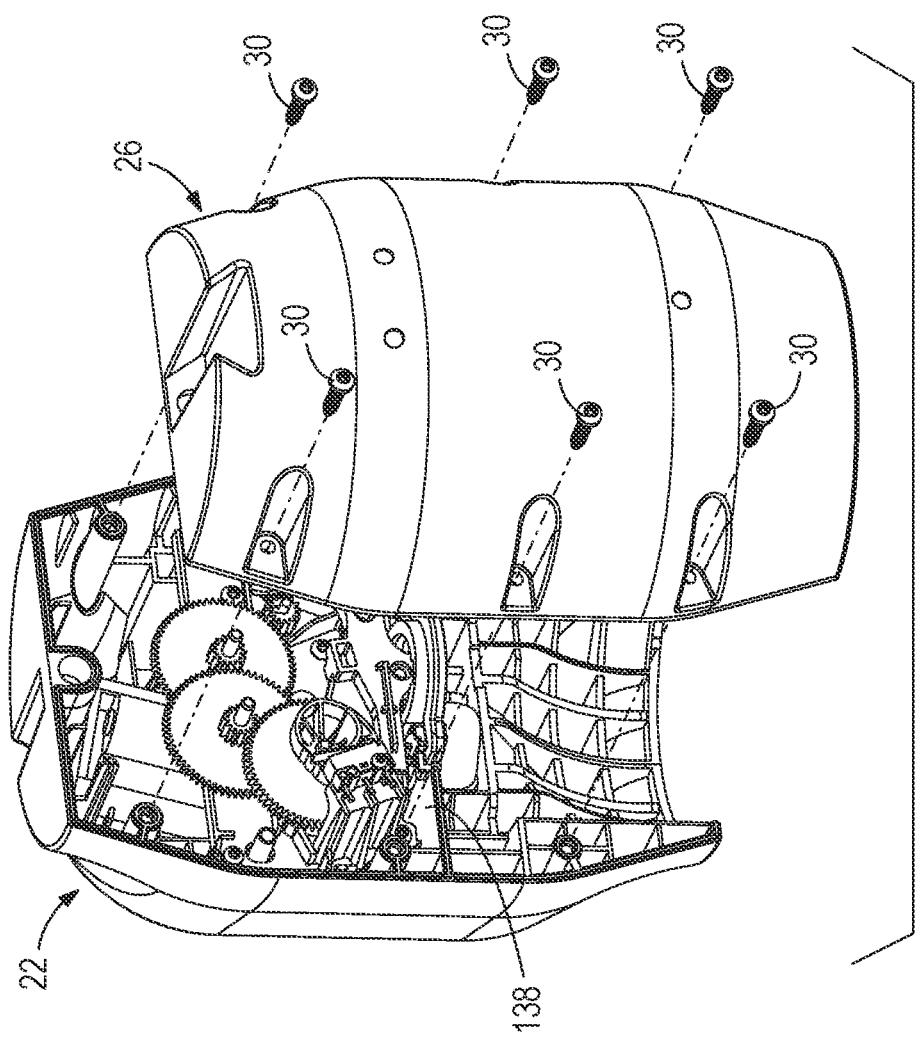

With reference to FIGS. 5A-5F, wires 126 may coupled (e.g., soldered) to the motor 58, the printed circuit board 34 and the battery holder 38, such that power may be supplied to the motor 58. Additionally, wires 126 may be coupled to the switch 86 and to the printed circuit board 34, such that activation of the switch 86 may be detected by the printed circuit board 34. The gear train assembly 42 may be placed within the upper chamber 50, and positioned adjacent the battery holder 38. Fasteners 130 may be used to fasten the gear train assembly 42 in place. In other embodiments, the gear train assembly 42 may be secured to the front enclosure 22 for example with heat stakes or through methods other than use of fasteners. With reference to FIGS. 5E and 5F, the rear enclosure 26 may then be fastened to the front enclosure 22, for example with the fasteners 30 (see FIG. 2) or via methods other than the use of fasteners.

Figure 7:
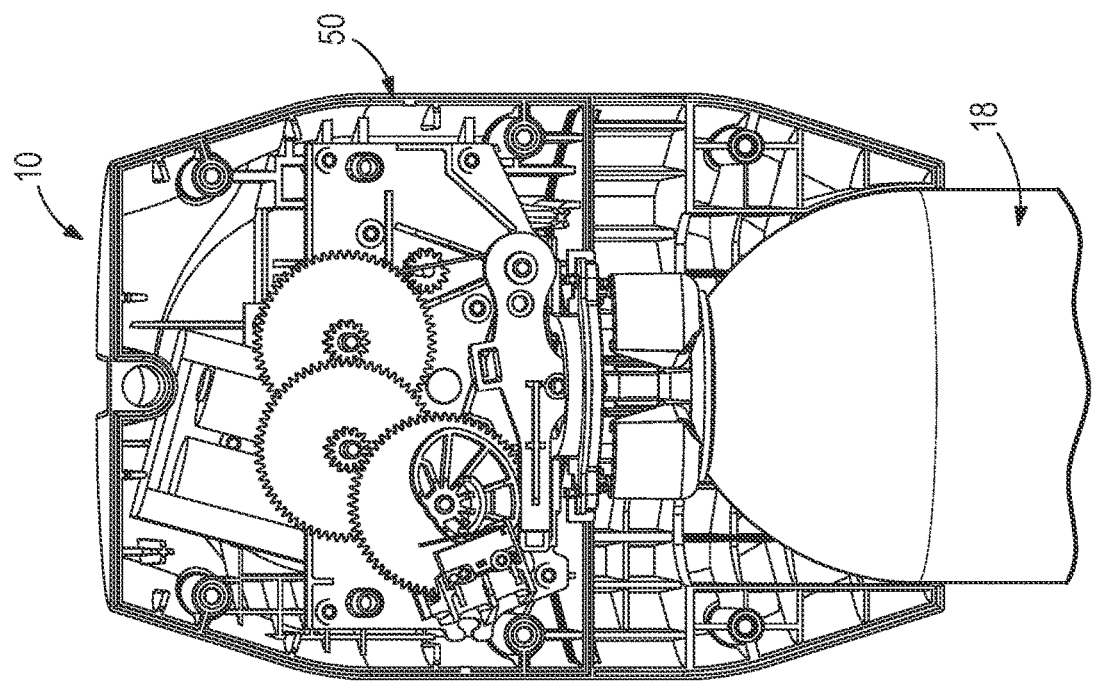
FIGS. 6 and 7 are perspective and cross-sectional views of the cabinet, respectively, illustrating how the cabinet includes a sealed compartment for the printed circuit board, the battery holder, and the gear train assembly.
Figure 6:
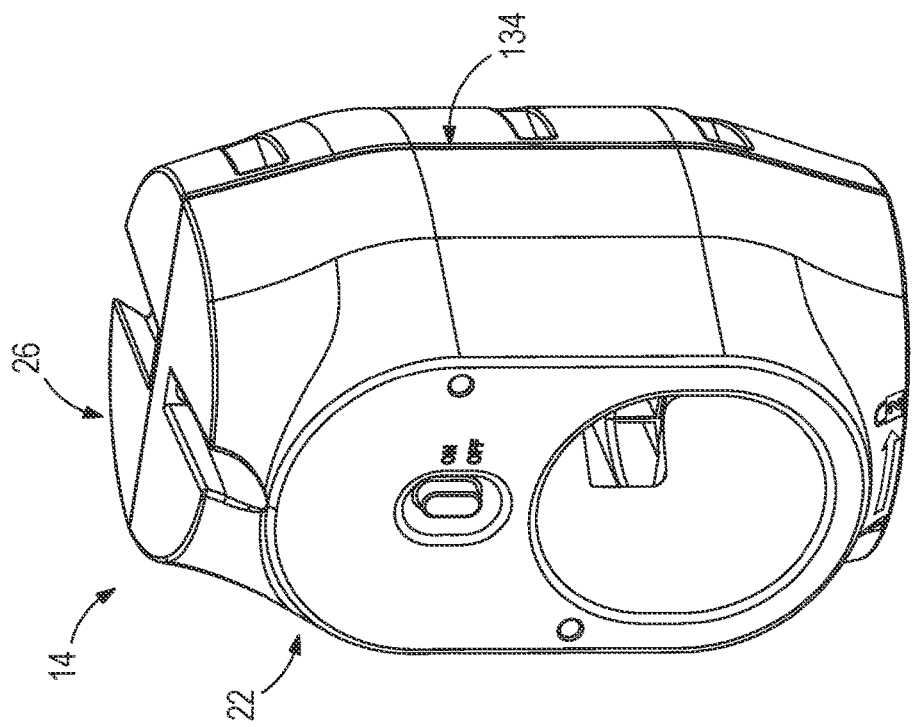

With reference to FIGS. 6 and 7, in some embodiments the front and rear enclosures 22, 26 form a seam. A gasket 134 (e.g., elastomeric seal) may be positioned at this seam, to help seal the inside of the cabinet 14 from the outside environment. Additionally, and with reference to FIG. 7, in some embodiments the upper chamber 50 is sealed off from the rest of the cabinet 14, and is sealed off from the aerosol can assembly 18 when the aerosol can assembly 18 is installed. For example, internal ledges 138 (see for example FIGS. 2, 8, and 9) and/or other structures of the front enclosure 22 and rear enclosure 26 may abut one another or overlap with one another when the front and rear enclosures 22, 26 are fastened together. These structures, in combination with the boot 102, the pressing region 106 within the cabinet 14, and/or the gasket 134, may seal off the upper chamber 50, and thus inhibit or prevent any residue from the aerosol can assembly 18 from leaking up into the upper chamber 50.

Figure 8:
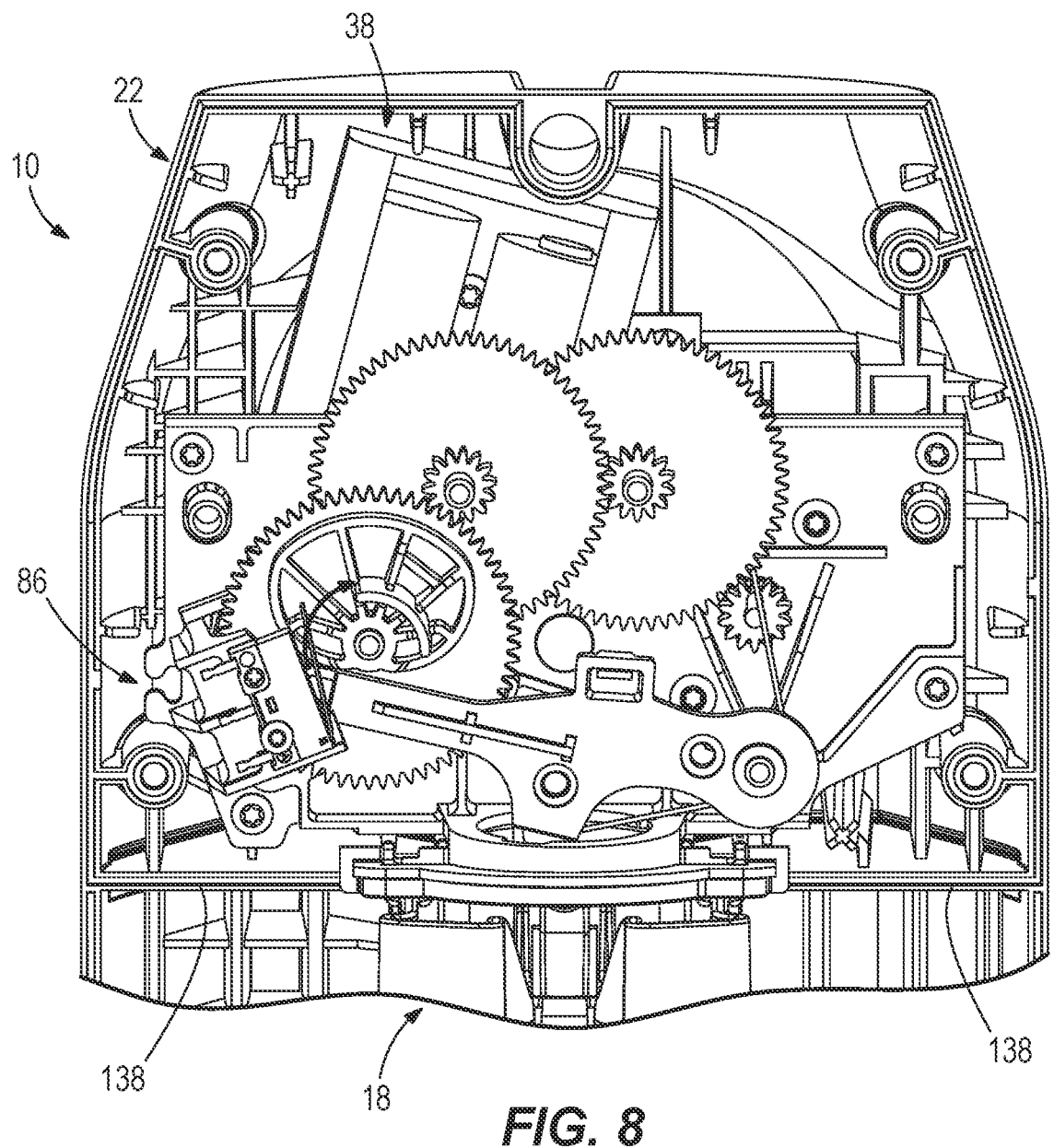
FIG. 8 is a perspective view within the cabinet, illustrating a cam and a plunger of the gear train assembly, the plunger in a first, raised position.
Figure 9:
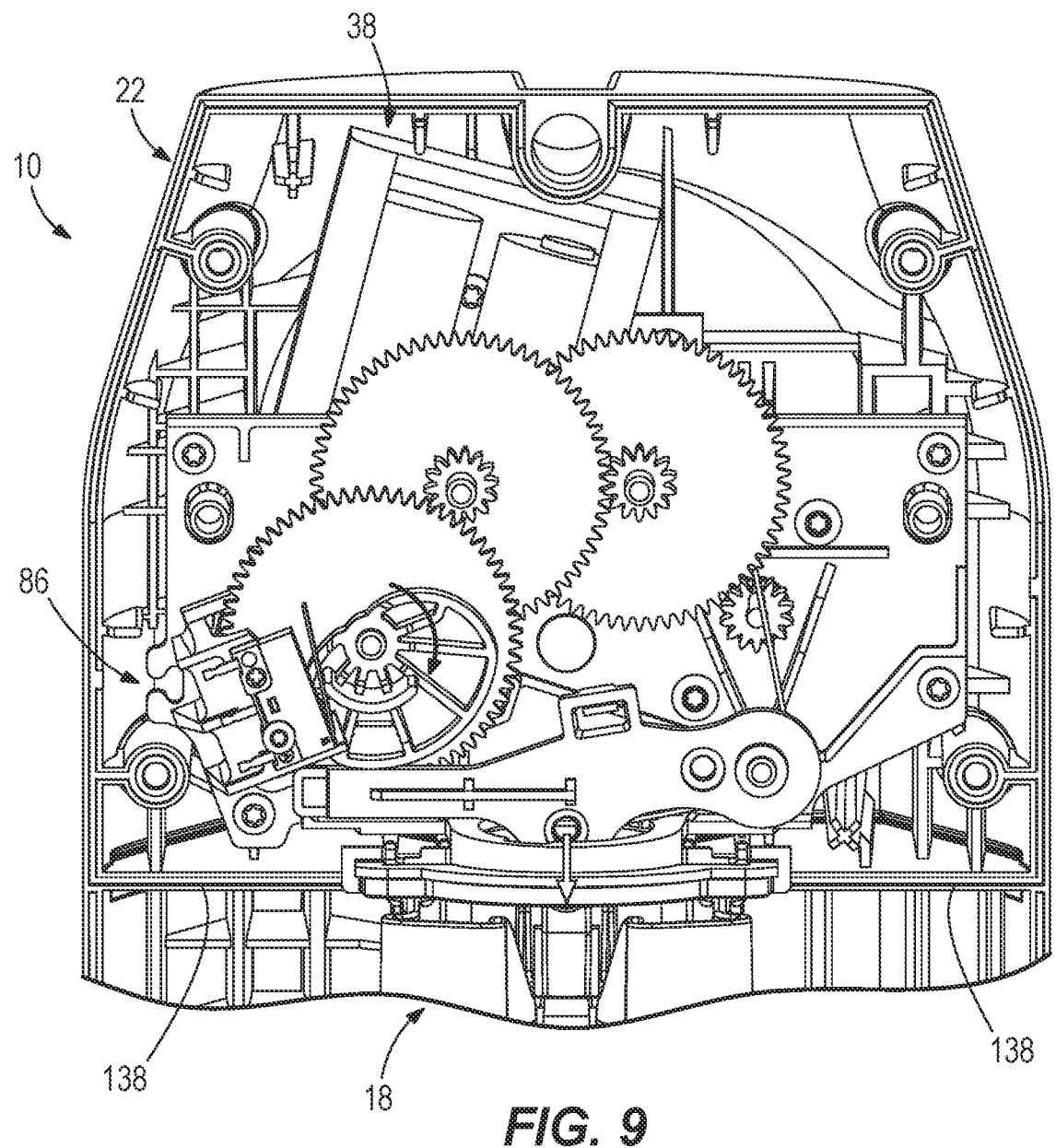
FIG. 9 is a perspective view within the cabinet, illustrating the plunger in a second, lowered position.

With reference to FIGS. 8, and 9, and as described above, the components within the upper chamber 50 are used to control dispensing of the pheromones from the aerosol can assembly 18. During operation the puffer device 10 may determine that it is time to dispense pheromones. For example, the printed circuit board 34 may receive a signal (e.g., wirelessly) that it is time to dispense, or the printed circuit board 34 may already be programmed to dispense pheromones at certain times of the day, or when certain environmental conditions are met (e.g., based on temperature, season, etc.). In some embodiments, the puffer device 10 may be prevented from dispensing pheromones, for example based on surrounding environmental conditions. n some embodiments, and as illustrated in FIG. 1, the cabinet 14 may include an on/off button or another button or buttons 140 that may be pressed manually to dispense the pheromones when desired or to otherwise control the puffer device 10.

During use, the printed circuit board 34 may send a signal to the motor 58, which in turn causes a rotation of the driven motor shaft 66. Rotation of the driven motor shaft 66 causes a rotation of the gears 78, which in turn causes a rotation of the cam 82. As illustrated in FIG. 4C, and as described above, the cam 82 includes a larger cam portion 83 and a smaller cam portion 84. When the gears 78 rotate, the cam 82 (including the larger cam portion 83 and the smaller cam portion 84) rotates as well. In the illustrated embodiment the cam 82 rotates in a clockwise direction, although in other embodiments the cam 82 may be arranged so as to rotate in a counterclockwise direction.

With reference to FIG. 9, the larger cam portion 83 is positioned to eventually rotate around and contact and push on the plunger arm 114, forcing the plunger arm 114 to rotate down. This rotational movement of the plunger arm 114 pushes the projection 118 down into the central aperture 98 and against the pressing region 106. The aerosol can assembly 18 is positioned directly below the pressing region 106, such that when the pressing region 106 is pressed down, it contacts the aerosol can assembly 18 (for example against a nozzle of the aerosol can assembly 18), causing the aerosol can assembly 18 to dispense pheromones. As described above, the upper chamber 50 is sealed off. Thus, when the pheromones are dispensed (e.g., sprayed), the upper chamber 50 remains isolated, and residue is inhibited or prevented from moving up into the upper chamber 50.

With continued reference to FIG. 9, as the cam 82 continues to rotate, the smaller cam portion 84 eventually comes into contact with the switch 86 (e.g., shortly after the larger cam portion 83 has pressed the plunger arm 114 down). When the switch 86 is contacted, a signal is sent from the switch 86 to the printed circuit board 34. The printed circuit board 34 then stops the motor 58 for a predetermined period of time. For example, in some embodiments the motor 58 is stopped for 1.5 seconds. In other embodiments the motor 58 is stopped for 1 second, or 2 seconds, or between 1-2 seconds. Other embodiments include different values and ranges. By stopping the motor 58, the gears 78 stop rotating, and the plunger arm 114 remains pressed down, so that the pheromones continue to be dispensed from the aerosol can assembly 18 for a predetermined period of time. Once this predetermined period of time has elapsed, the printed circuit board 34 then starts the motor 58 again, and the gears 78 again begin to rotate. Rotation of the gears 78 causes the cam 82 (including both the larger cam portion 83 and the smaller cam portion 84) to rotate, and for the larger cam portion 83 to move out of contact with the plunger arm 114 and the smaller cam portion 84 to move out of contact with the switch 86. Once the larger cam portion 83 is out of contact with the plunger arm 114, the biasing element 122 raises the plunger arm 114 back up (FIG. 8). In some embodiments the switch 86 is not provided. Rather, the cam 82 itself remains in contact with and pressed down long enough on the plunger arm 114 to emit a sufficient amount of pheromones from the aerosol can assembly 18 before the cam 82 is rotated out of contact with the plunger arm 114. Additionally, while both the larger cam portion 83 and the smaller cam portion 84 are both positioned on a single cam 82, in other embodiments the larger cam portion 83 and the smaller cam portion 84 may each be positioned on separate cams 82 (e.g., coupled to different gears 78 within the cabinet 14).

Overall, the use of the cam 82 described above may provide for consistent strokes of the plunger arm 114 (e.g., causing the projection 118 to move down the same distance with each stroke), and thus consistent emission of pheromones. In the illustrated embodiment the motor 58 does not need to reverse direction to stop emission of the pheromones. Rather, the motor 58 may continue to operate in one direction, causing the cam 82 to continue to rotate (e.g., clockwise) until a further emission of pheromones is needed. Because of this directional motion, the life of the motor 58 may be extended, and stalling of the motor 58 may be prevented or inhibited.

Figure 10:
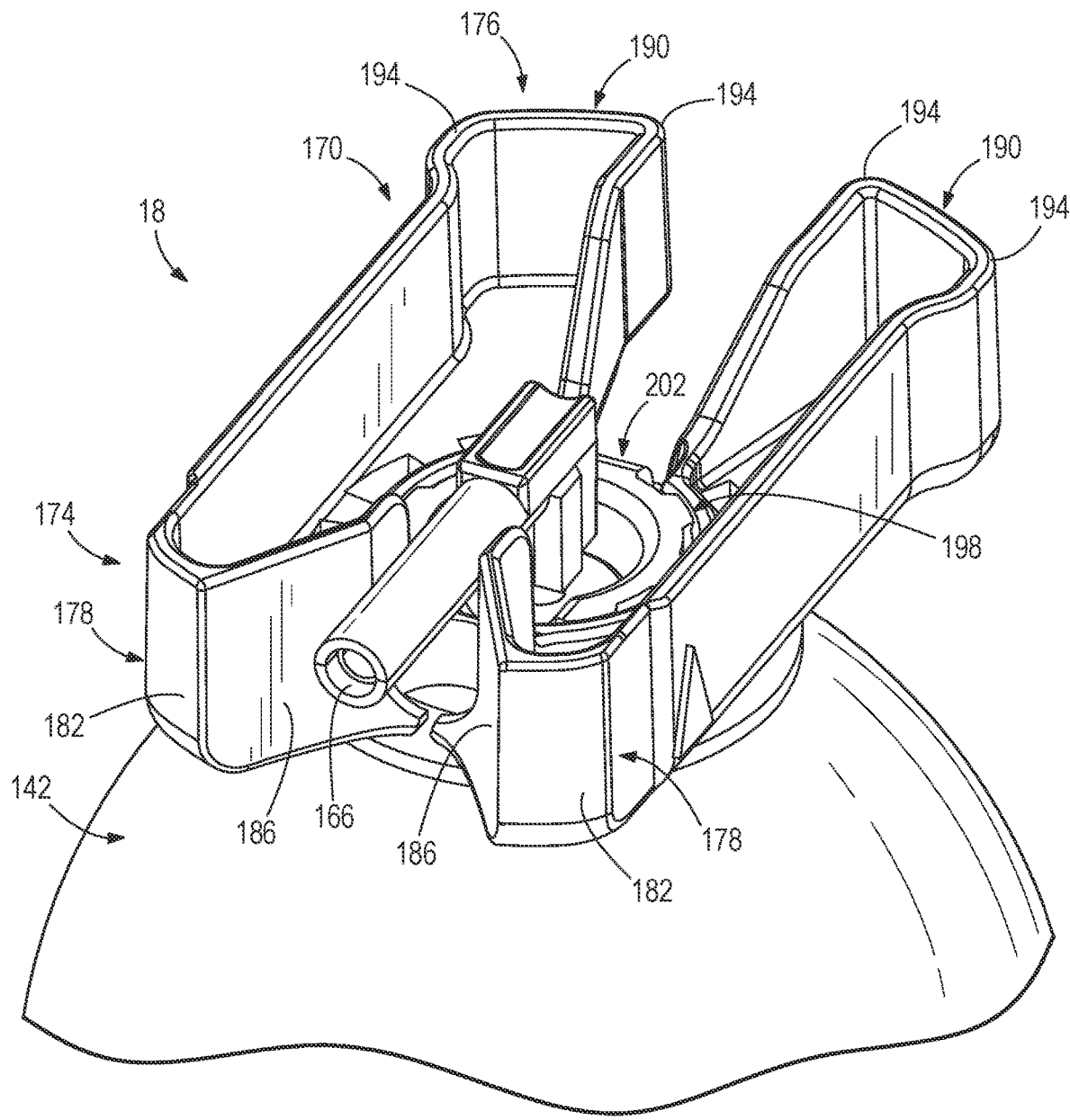
FIG. 10 is an enlarged, perspective view of a portion of the aerosol can assembly, illustrating a top of an aerosol can, an adapter coupled to the aerosol can, and a lock coupled to the adapter.
Figure 11:
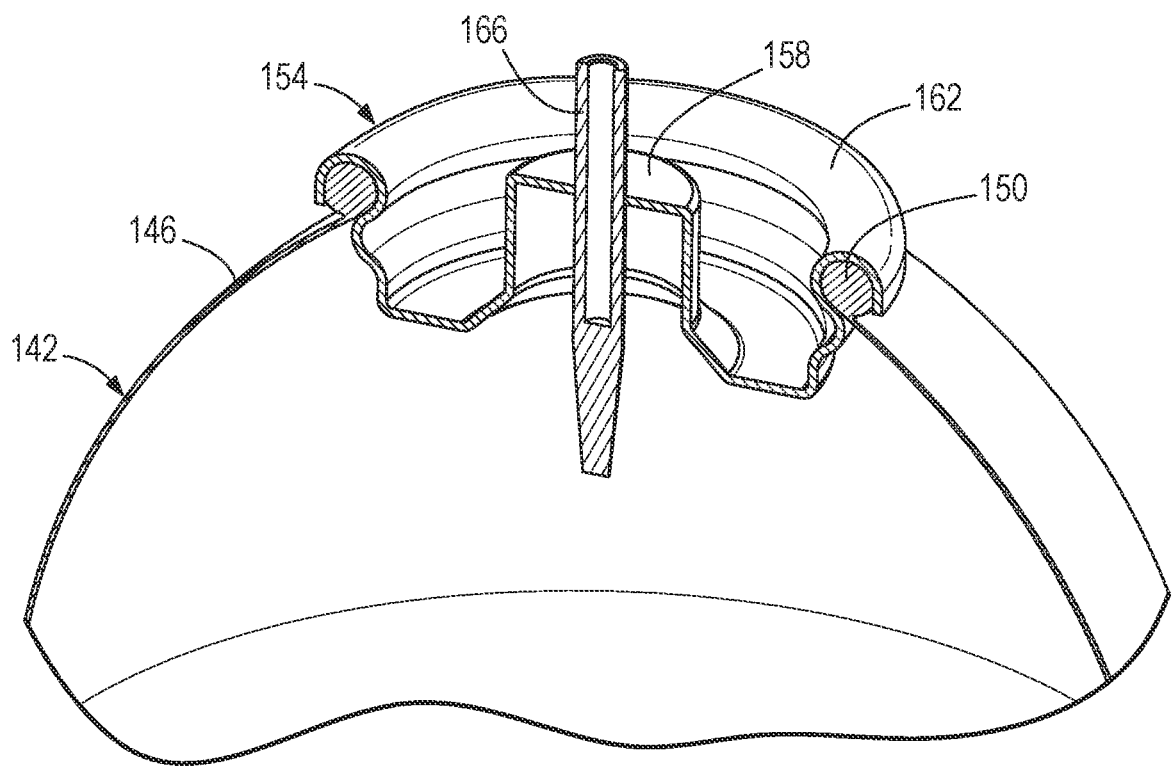
FIGS. 11 and 12 are perspective, cross-sectional views of the top of the aerosol can, illustrating a crimped valve on the top of the aerosol can.
Figure 12:
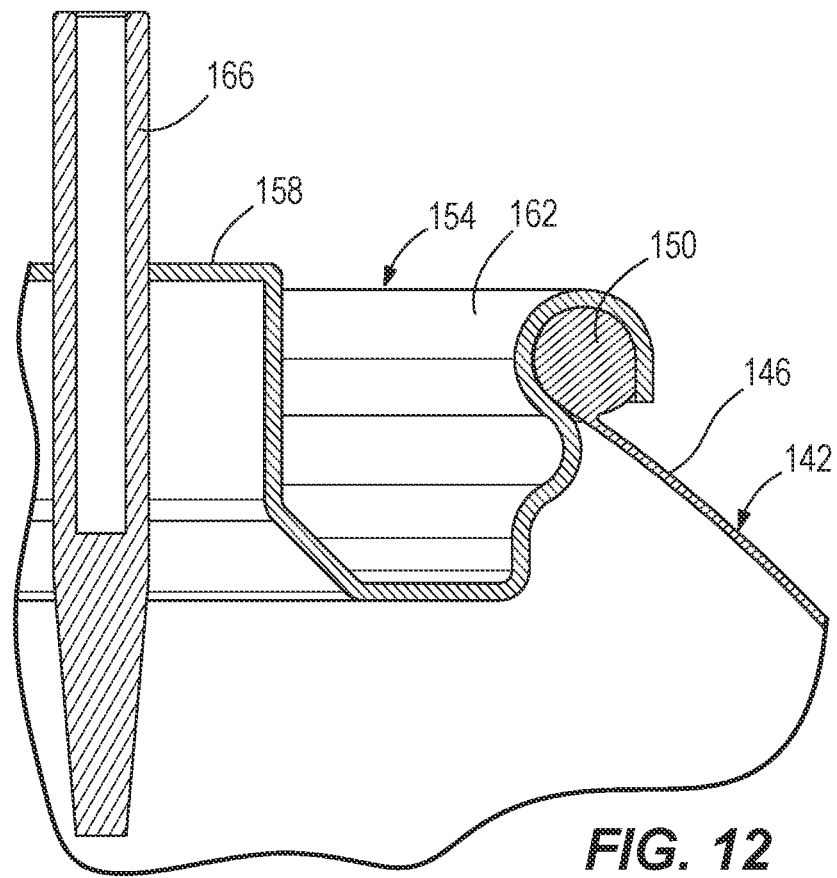

With reference to FIGS. 1 and 10-12, the aerosol can assembly 18 includes an aerosol can 142 that contains the pheromones described above. As illustrated in FIGS. 11 and 12, the aerosol can 142 includes a top end 146 with a rim 150 (e.g., a circumferential rim) that defines an opening. A valve 154 is coupled to the rim 150 and extends across the opening. The valve 154 includes a central, raised section 158, as well as a separate, outer raised lip 162 that is crimped onto the rim 150. A nozzle 166 (which may include an actuator) extends through the valve 154 (e.g., centrally through the central, raised section 158). Pheromones from the aerosol can 142 are released through the nozzle 166, for example by pressing down on or otherwise moving a portion of the nozzle 166.

With reference to FIGS. 1, 10, 13, and 14, the aerosol can assembly 18 further includes an adapter 170. As illustrated in FIG. 10, the adapter 170 includes a first end 174 and an opposite, second end 176. The first end 174 includes a first set of projections (e.g., arms) 178 that generally form a V-shaped, U-shaped, or other shaped cavity or space there between. When the adapter 170 is coupled to the aerosol can 142, the nozzle 166 extends between the projections 178 within this cavity or space. In some embodiments the adapter 170 replaces the need for a cap for the aerosol can 142. In the illustrated embodiment, each of the projections 178 includes a generally rounded surface 182 along a portion of the projection 178, as well as a generally flat, angled surface 186 along another portion of the projection 178. Other embodiments include different shapes and sizes for the projections 178 than that illustrated.

With continued reference to FIG. 10, the second end 176 includes a second set of projections (e.g., flexible arms) 190 that also generally form a V-shaped, U-shaped, or other-shaped cavity or space there between. In the illustrated embodiment, each of the projections 190 includes generally rounded surfaces 194 at ends of the projections 190.

With reference to FIGS. 10 and 13-16, the adapter 170 further includes a lower attachment region 198 that is disposed generally between the first set of projections 178 and the second set of projections 190, and extends below the first set of projections 178 and the second set of projections 190. In the illustrated embodiment the lower attachment region 198 is generally a circumferential ring that defines a central opening 202. As illustrated in FIGS. 13-16, the lower attachment region 198 includes at least one lower, radially outwardly projecting portion 206 (e.g., tab, rib, etc.).

Figure 13:
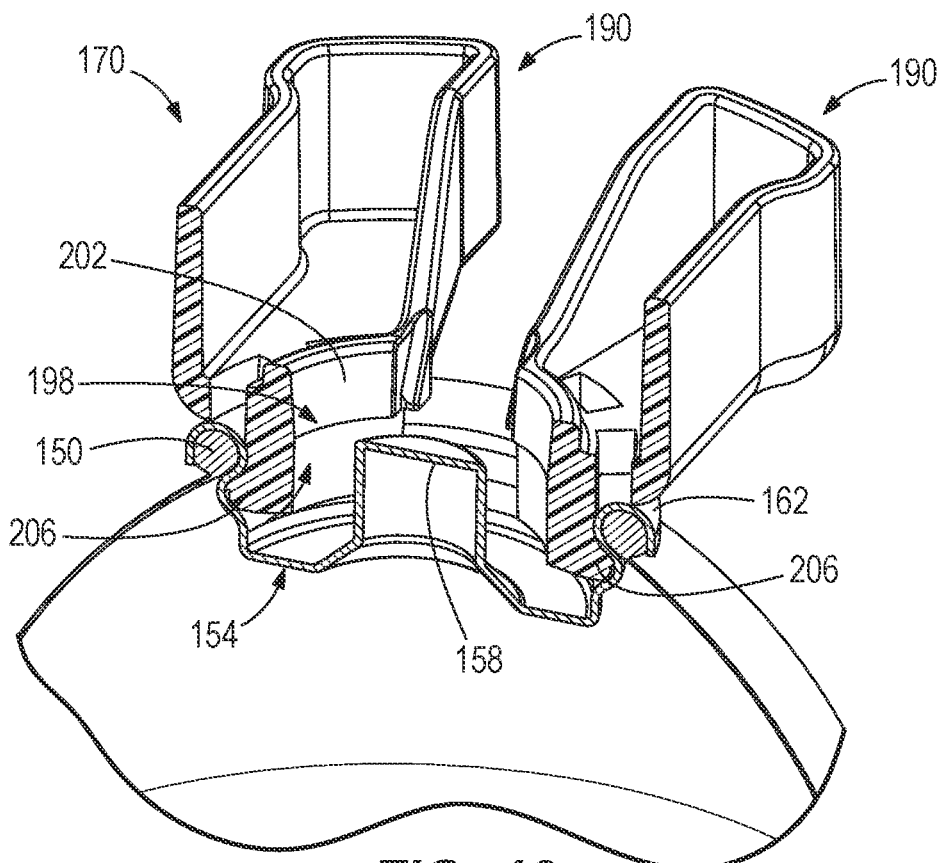
FIGS. 13 and 14 are perspective, cross-sectional views of the top of the aerosol can, illustrating the adapter coupled to the crimped valve.
Figure 14:
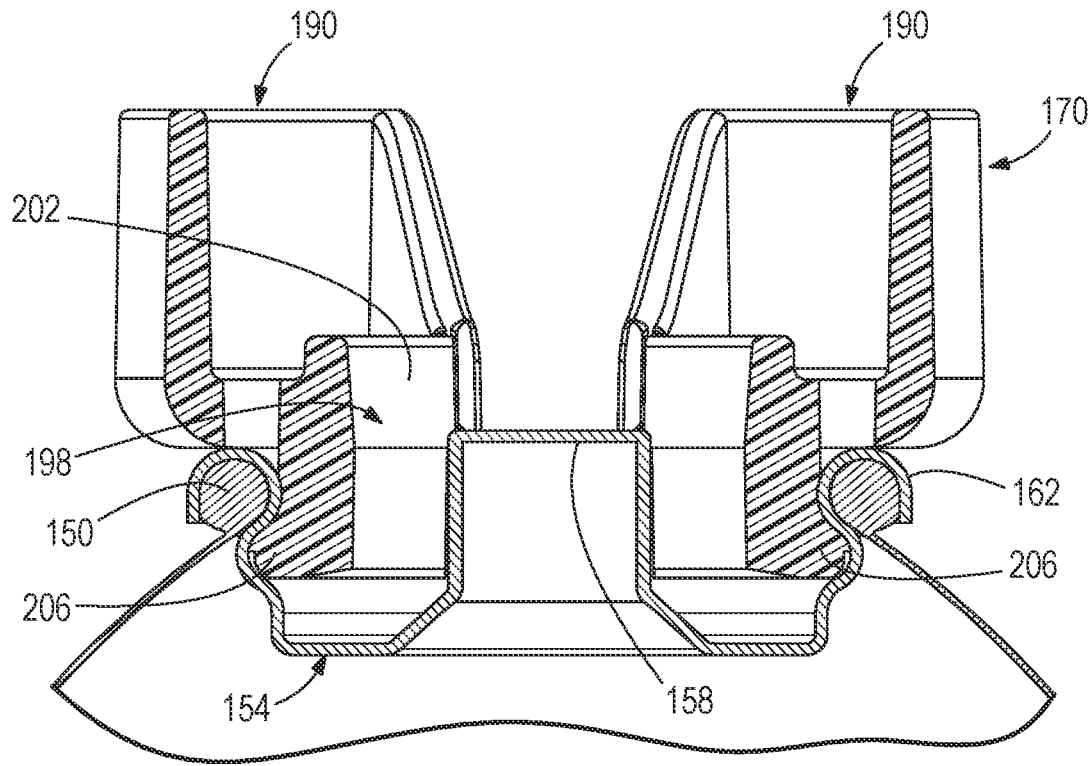

With reference to FIGS. 13 and 14, the adapter 170 may initially be coupled to the valve 154 by pressing the lower attachment region 198 of the adapter 170 down over the central, raised section 158, until the projecting portion or portions 206 generally snap underneath or are otherwise positioned adjacent or underneath the lip 162 of the valve 154 and the rim 150 of the aerosol can 142.

Figure 15:
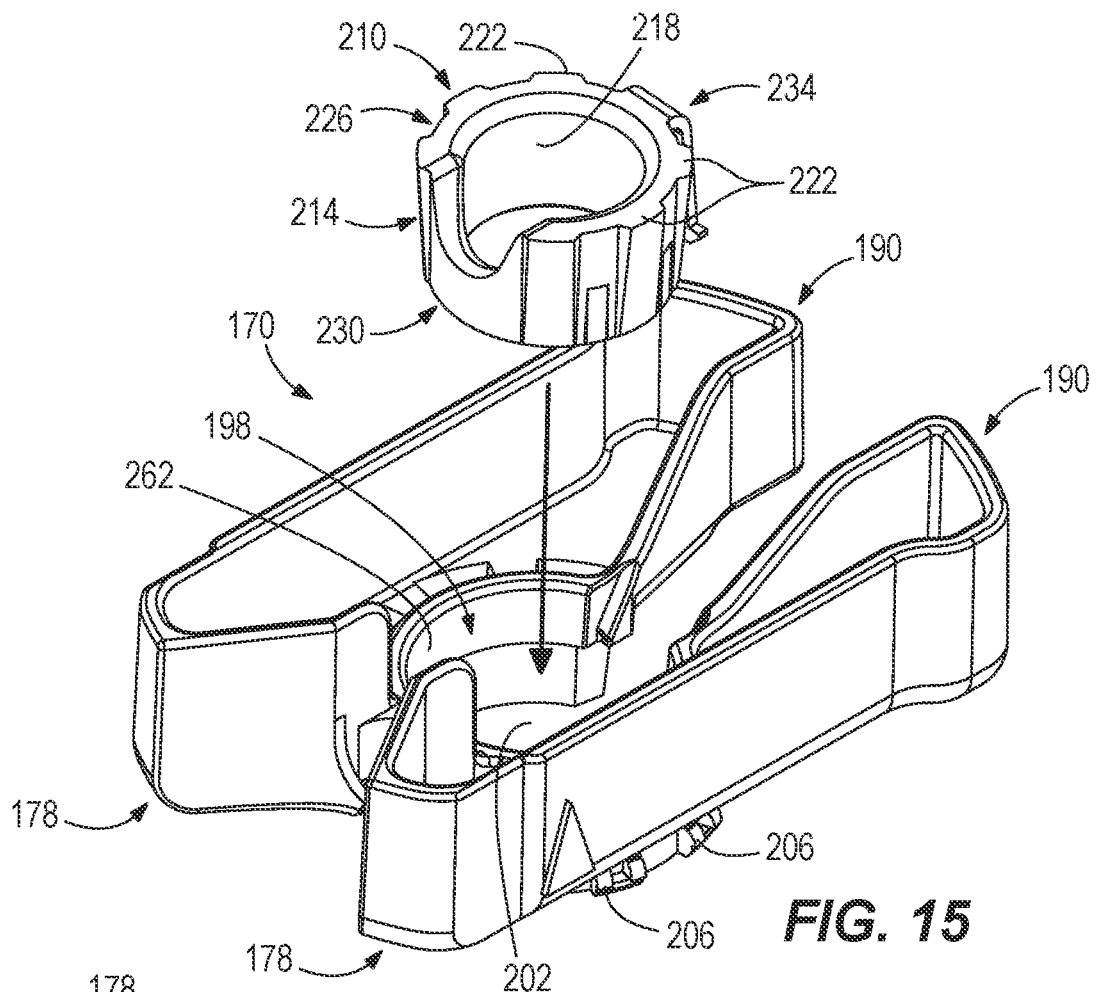
FIGS. 15-17 are perspective views of the adapter and the lock, illustrating the lock being pushed down and coupled to the adapter.
Figure 16:
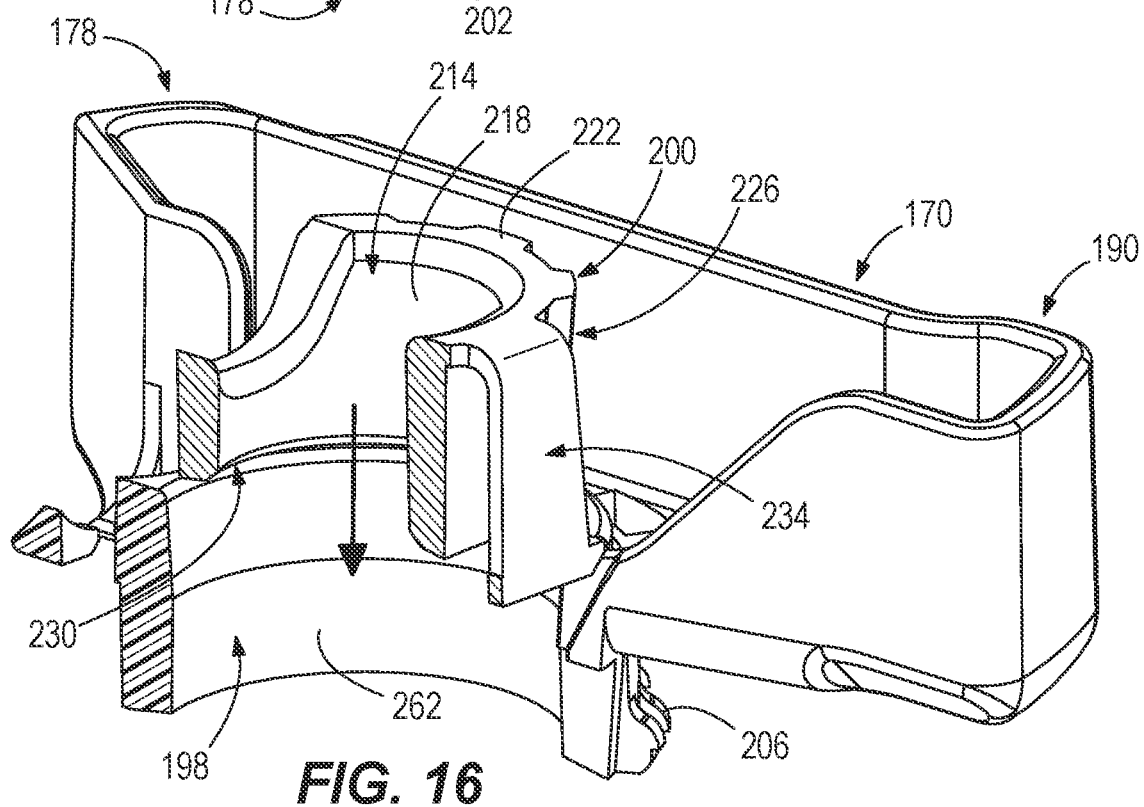

With reference to FIGS. 15-23, once the adapter 170 has been coupled to the valve 154, a lock 210 may then be used to secure the adapter 170 in place. In the illustrated embodiment the lock 210 is a generally ring-like structure that is sized and shaped to fit within the central opening 202 formed by the lower attachment region 198 of the adapter 170. As illustrated in FIGS. 15 and 16, the lock 210 includes a body 214 that defines a central opening 218. The central opening 218 is sized and shaped to accommodate and receive the central, raised section 158 of the valve 154. The body 214 includes a series of tapered ribs 222 spaced circumferentially around the body 214. The ribs 222 taper axially, such that along a top region 226 of the lock 210 the ribs 222 extend radially outwardly farther than along a lower region 230 of the lock 210.

Figure 17:
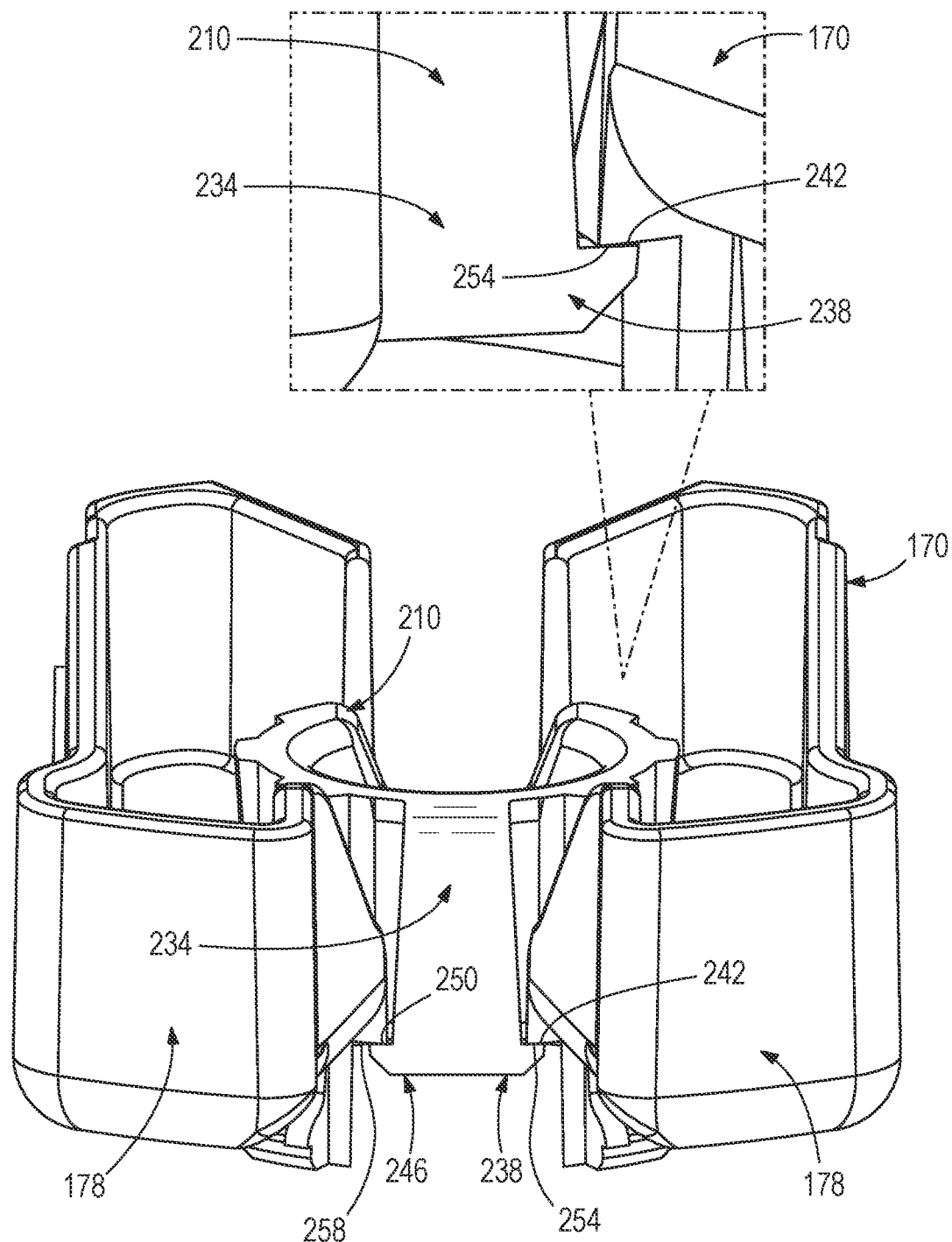

With reference to FIGS. 15-17, the lock 210 further includes an elongate projecting tab 234. As illustrated in FIG. 17, the tab 234 has a generally T-shaped structure at its distal end that includes a first arm 238 with a first engagement surface 242 and a second arm 246 with a second engagement surface 250. Other embodiments include different sizes and shapes for the tab 234 than that shown. As illustrated in FIG. 17, the adapter 170 includes a corresponding first engagement surface 254 and a second engagement surface 258 (e.g., each disposed on the lower attachment region 198). When the lock 210 has been pressed down and coupled to the adapter 170, the first engagement surface 242 of the tab 234 is directly below the first engagement surface 254 of the adapter 170, and the second engagement surface 250 of the tab 234 is directly below the second engagement surface 258 of the adapter 170. This positioning of the tab 234 and the engagement surfaces 242, 250, 254, 258 may be achieved by pressing the lock 210 directly down onto the adapter 170 until the tab 234 snaps in place.

Figure 19:
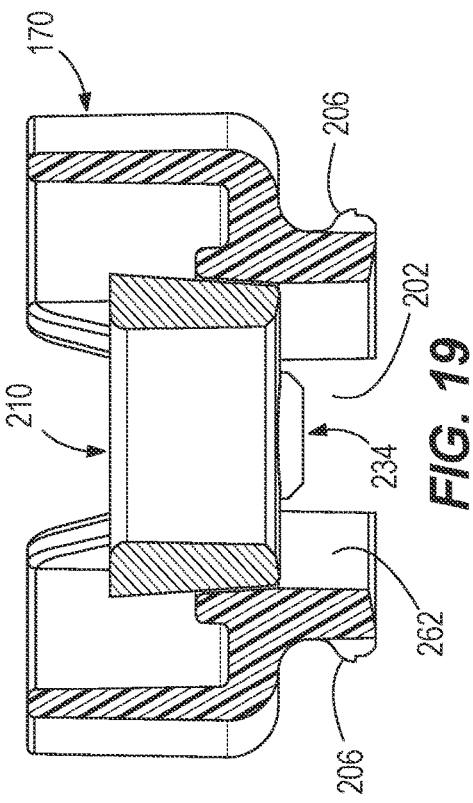
FIGS. 18 and 19 are perspective, cross-sectional views of the adapter and lock, illustrating a minimum locked position.
Figure 21:
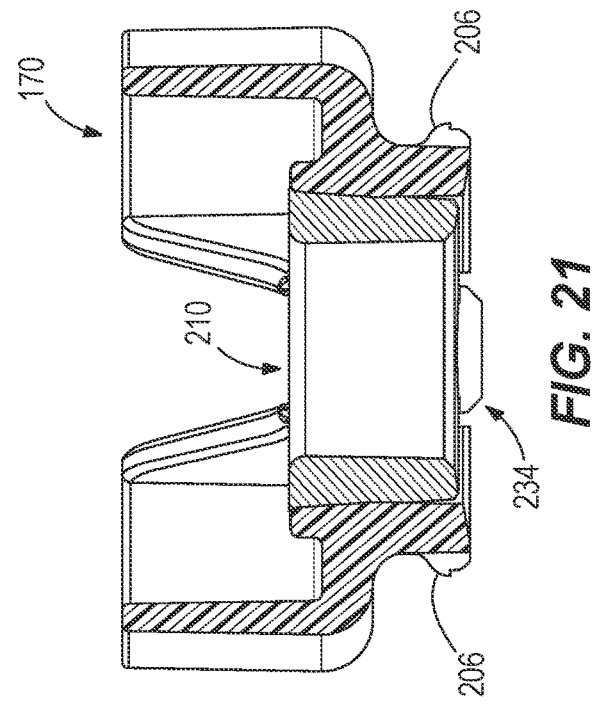
FIGS. 20 and 21 are perspective, cross-sectional views of the adapter and lock, illustrating a maximum locked position.
Figure 18:
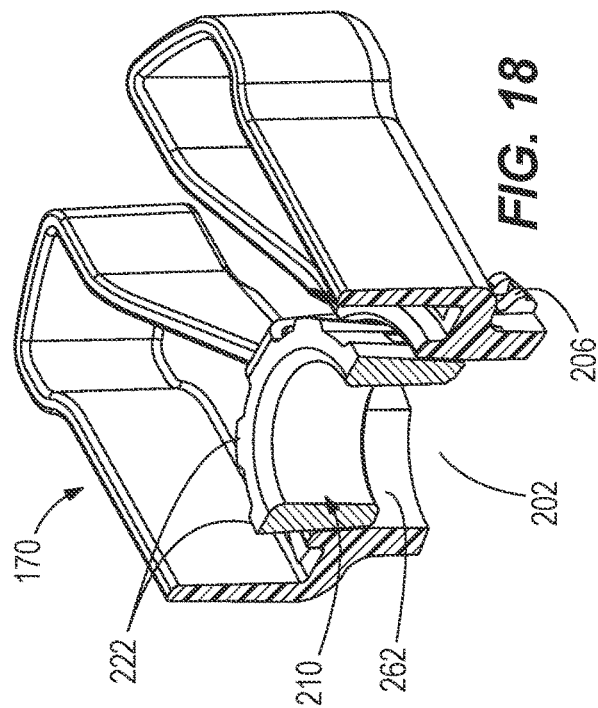

With reference to FIGS. 18-23, when the lock 210 is being pressed down onto the adapter 170, the ribs 222 of the lock 210 also engage and press radially outwardly against an inner surface 262 of the lower attachment region 198 (e.g., due to the tapered nature of the ribs 222), forcing the projecting portions 206 further radially outwardly to lock the adapter 170 in place. As illustrated in FIGS. 17-19, when the distal end of the tab 234 has snapped beneath the first and second engagement surfaces 254, 258 of the adapter 170, the lock 210 may be considered to be in a minimum locked position, with the ribs 222 pressing the projecting portions 206 radially outwardly and the tab 234 acting as a stop to inhibit or prevent the lock 210 from being raised up axially. With reference to FIGS. 20-23, the lock 210 may be pressed down even farther until a maximum locked position is reached. In this maximum locked position illustrated in FIGS. 20-23, the lock 210 extends entirely or substantially entirely through the central opening 202, with the central, raised section 158 extending up through the central opening 218 of the lock 210. Additionally, in this maximum locked position the projecting portions 206 have been pressed out radially as far as possible. The ability of the lock 210 to move between the minimum and maximum locked positions allows the lock 210 to be used, for example, with cans of varying crimp dimensions.

Figure 24:
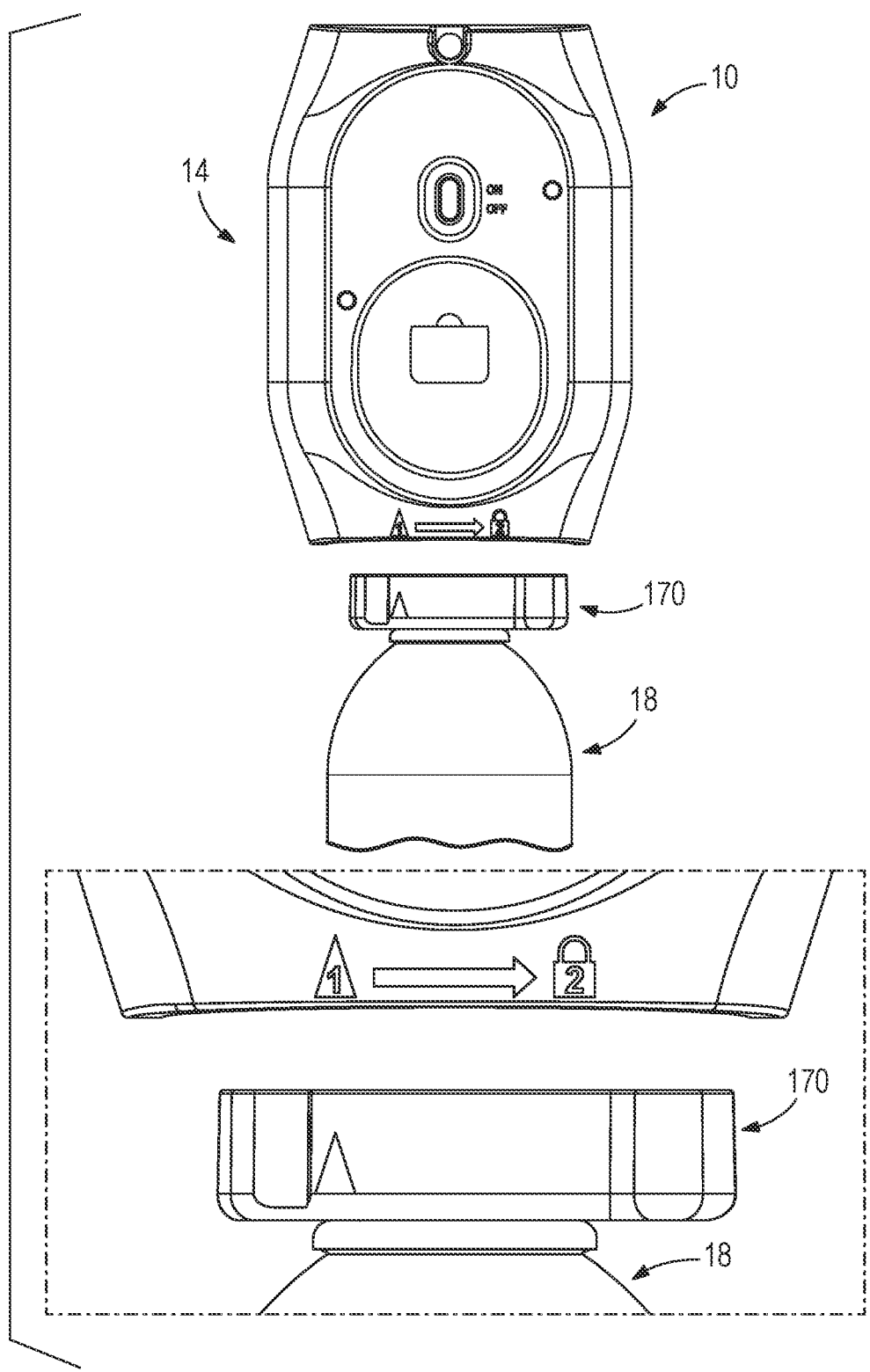
FIG. 24 is a front, exploded view of the puffer device, illustrating an initial installation position of the aerosol can assembly relative to the cabinet.
Figure 25:
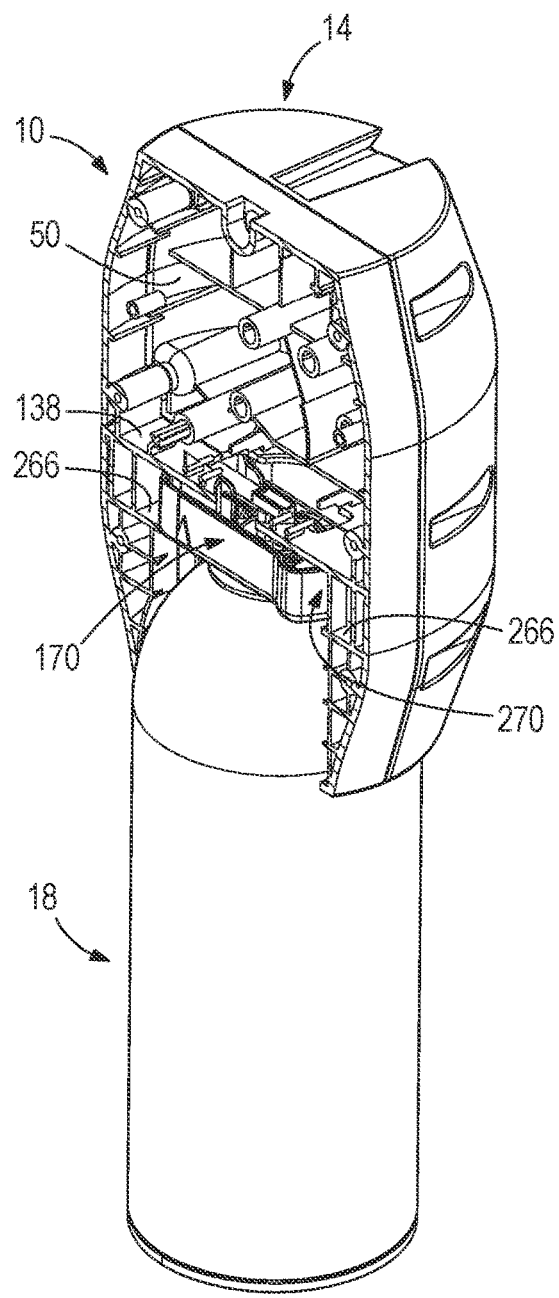
FIGS. 25 and 26 are cross-sectional views of the puffer device, illustrating the aerosol can assembly in a first installation position within the cabinet.
Figure 26:
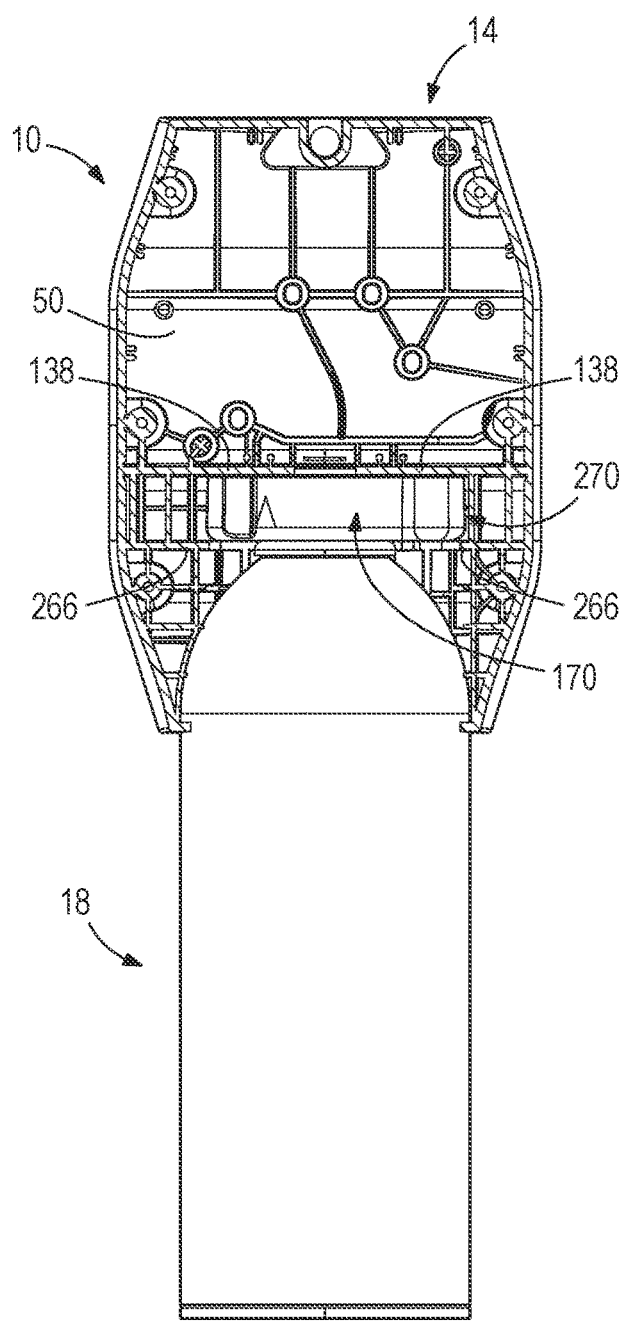

With reference to FIGS. 24-31, the aerosol can assembly 18 may be coupled to the cabinet 14 via a rotational movement of the aerosol can assembly 18 within the cabinet 14. For example, as illustrated in FIG. 24, the cabinet 14 and/or the adapter 170 may include a marking or markings indicating in initial insertion position of the adapter 170 into the cabinet 14. Other embodiments do not include such markings. With reference to FIGS. 25 and 26, the aerosol can assembly 18 may first be pressed up linearly into the cabinet 14. The cabinet 14 may include one or more internal ledges 266 or other structures that create a keyway for insertion of the adapter 170. Thus, in some embodiments, the adapter 170 may only be inserted into the cabinet 14 if the adapter 170 is first in a predefined rotational position relative to the cabinet 14. With continued reference to FIGS. 25 and 26, once the adapter 170 is inside the cabinet 14, the adapter 170 may be limited from further insertion by the internal ledges 138 described above that define the upper chamber 50. The adapter 170 thus sits within a lower chamber 270 (e.g., below the upper chamber 50 described above).

Figure 20:
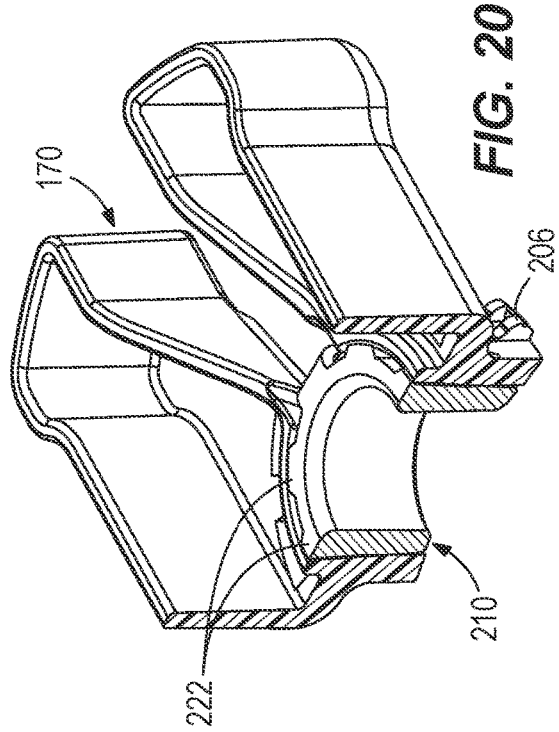
Figure 22:
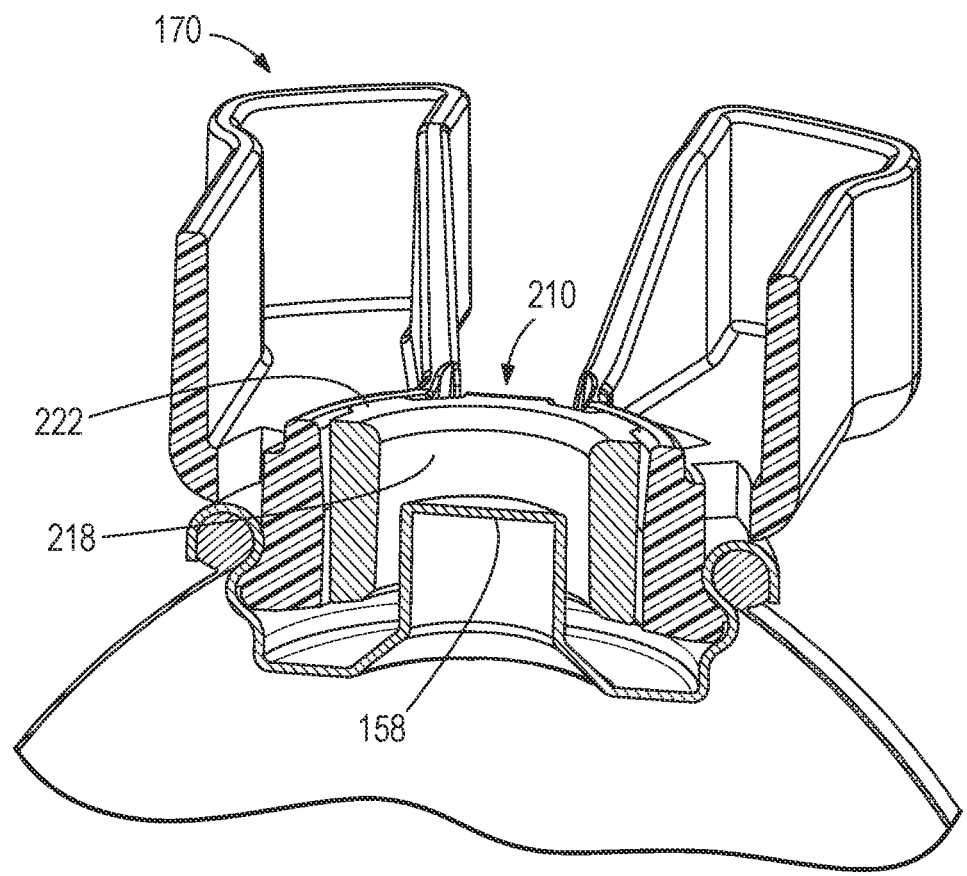
FIGS. 22 and 23 are perspective, cross-sectional views of the top of the aerosol can, illustrating the adapter and the lock in the maximum locked position.
Figure 23:
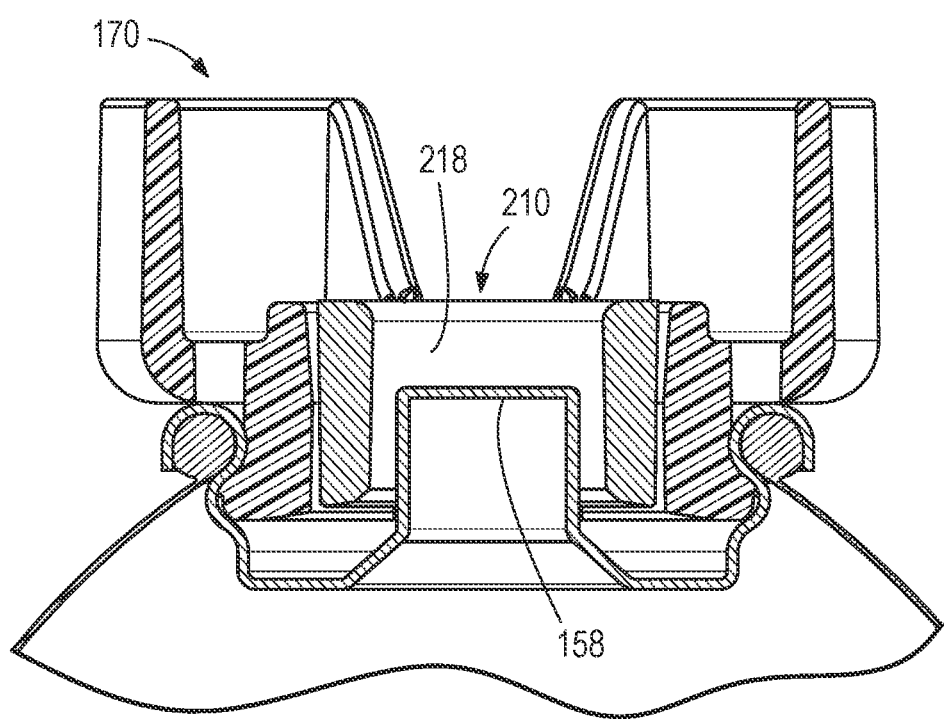
Figure 31:
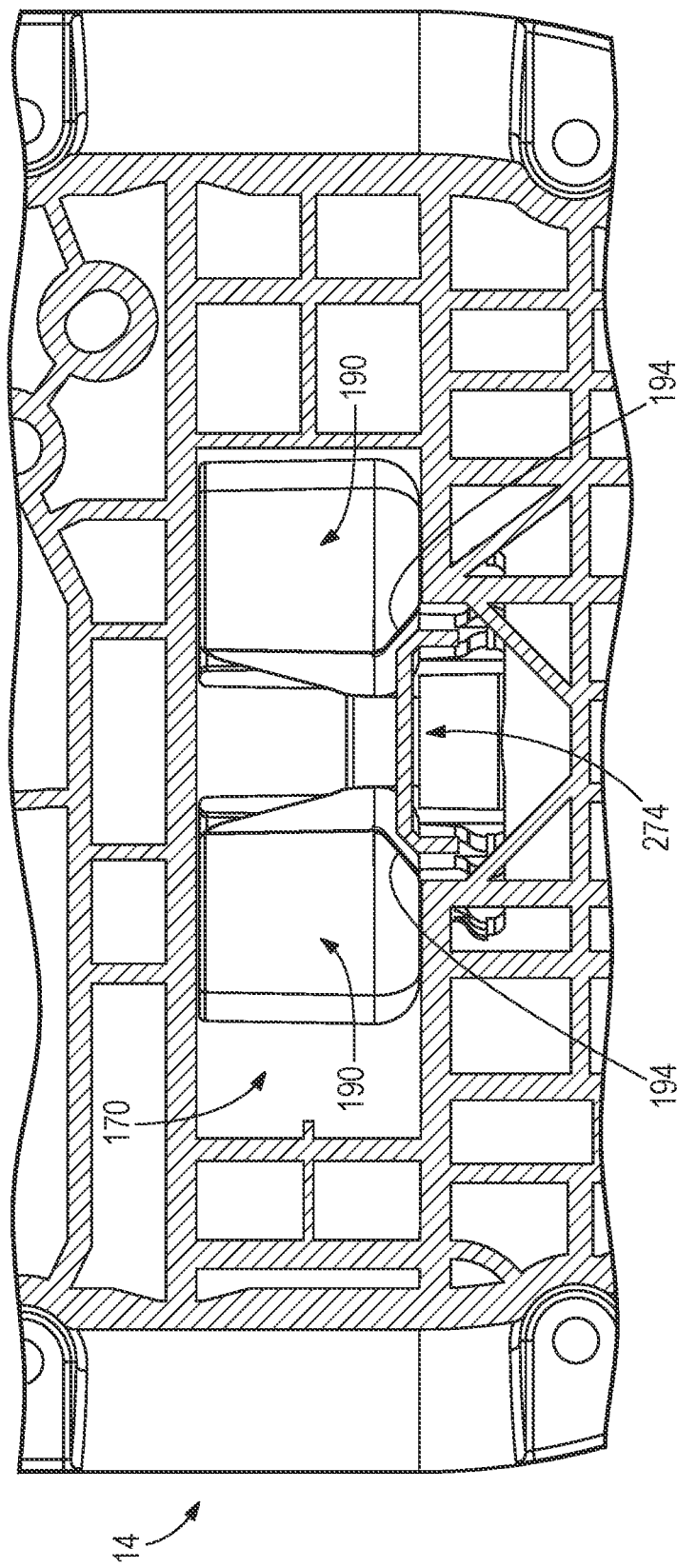
FIG. 31 is a cross-sectional view of a portion of the rear enclosure, illustrating the adapter coupled to the locking tab.
Figure 33:
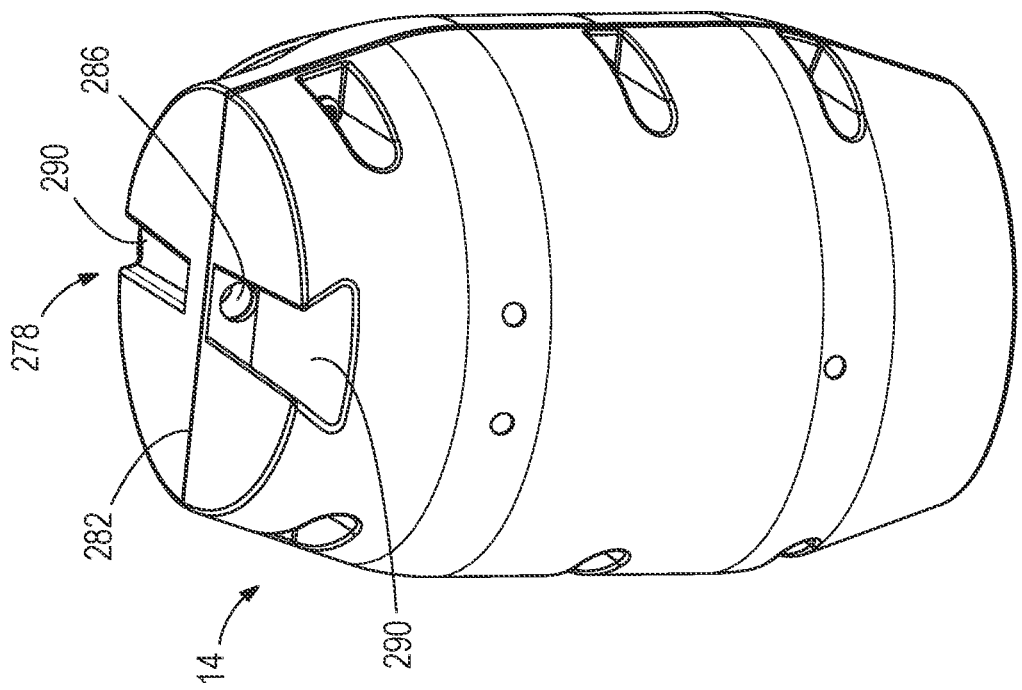
FIG. 33 is a perspective view of the cabinet, illustrating the keyed region.
Figure 32:
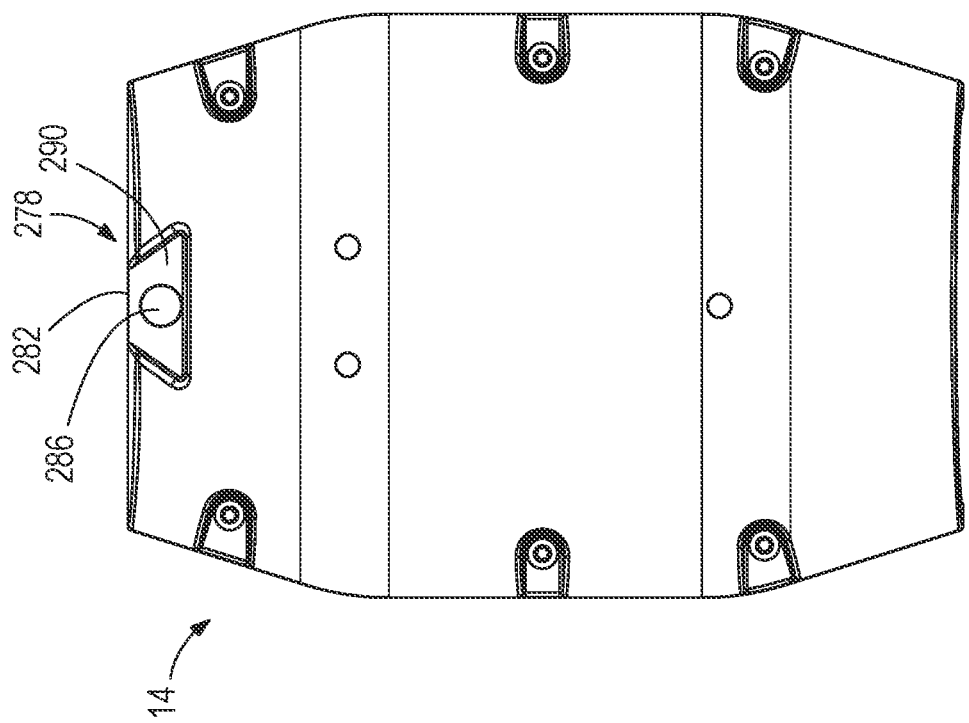
FIG. 32 is a rear view of the cabinet, illustrating a keyed region at a top of the cabinet.

With reference to FIGS. 27 and 28, the aerosol can assembly 18, including the adapter 170, may then be rotated (e.g., 90 degrees or any other predefined angle) within the lower chamber 270 to a locked position. As illustrated in FIGS. 29 and 20, the cabinet 14 may include a locking tab 274 positioned within the lower chamber 270 (e.g., within the rear enclosure 26). With reference to FIGS. 30 and 31, when the adapter 170 is rotated to the locked position, the generally rounded surface 194 of one of the projections 190 on the first end 174 of the adapter 170 slides and snaps up and over the locking tab 274, such that the locking tab 274 is thereby positioned between the two projections 190. In the illustrated embodiment the projections 190 are generally flexible, thus facilitating flexing and movement. As illustrated in FIG. 31, in the locked position the adapter 170 is generally inhibited from easily rotating again within the lower chamber 270. To rotate the adapter 170 and remove the aerosol can assembly 18 from the cabinet, the adapter 170 is rotated hard enough in an opposite direction to force the projection 190 back up and over the locking tab 274. While a single locking tab 274 on the cabinet 14 and two projections 190 on the adapter 170 are illustrated, various other snap-fit engagements may also be used to releasably couple the adapter 170 (and the aerosol can assembly 18) overall to the cabinet 14.

With reference to FIGS. 32-38, in some embodiment the puffer device 10 may include a keyed region to couple one or more different hanging devices to hang the puffer device 10 within an agricultural environment (e.g., from a tree branch, pole, etc.). For example, and with reference to FIGS. 32 and 33, in the illustrated embodiment the puffer device 10 includes a keyed region 278 generally along a top of the cabinet 14. The keyed region 278 includes a rib 282 defining an aperture 286. The rib 282 and the aperture 286 are located generally centrally along the top of the cabinet 14, although in other embodiments they may be located at other locations on the cabinet 14. With continued reference to FIGS. 32 and 33, the keyed region 278 further includes channels 290 disposed on opposite sides of the rib 282. In the illustrated embodiment the channels 290 have dovetail cross-sectional shapes, although other embodiments include other shapes (e.g., generally circular, oval, etc.). Additionally, other embodiments may include different numbers of apertures and/or channels than that illustrated.

Figure 34:
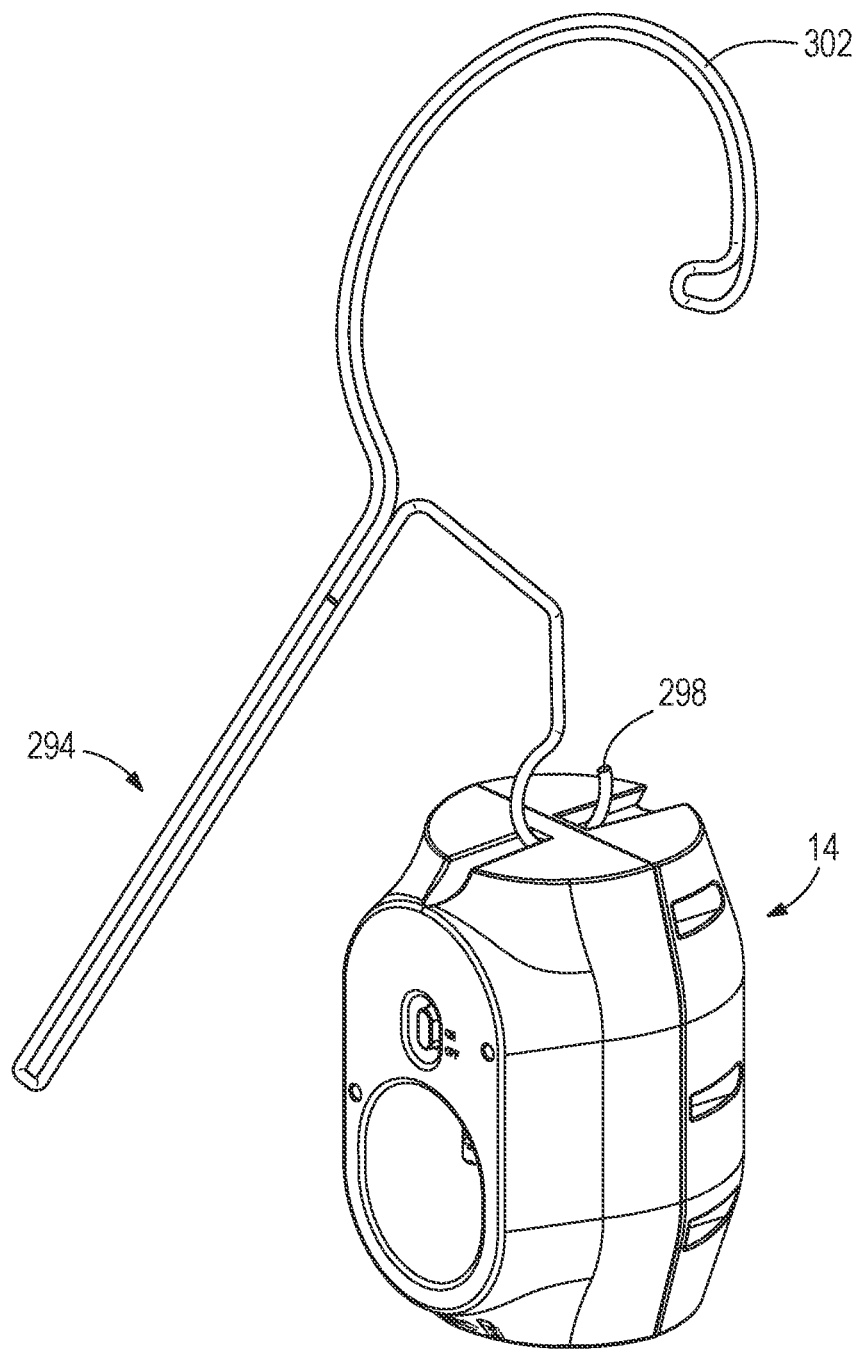
FIG. 34 is a perspective view of the cabinet and a first hanging device coupled to the keyed region.

With reference to FIG. 34, the puffer device 10 may include a first hanging device 294 that includes a hook region 298 that passes through the aperture 286. The first hanging device 294 may further include a second hook region 302 that hooks over a tree branch, pole, etc., so as to hang the puffer device 10.

Figure 36:
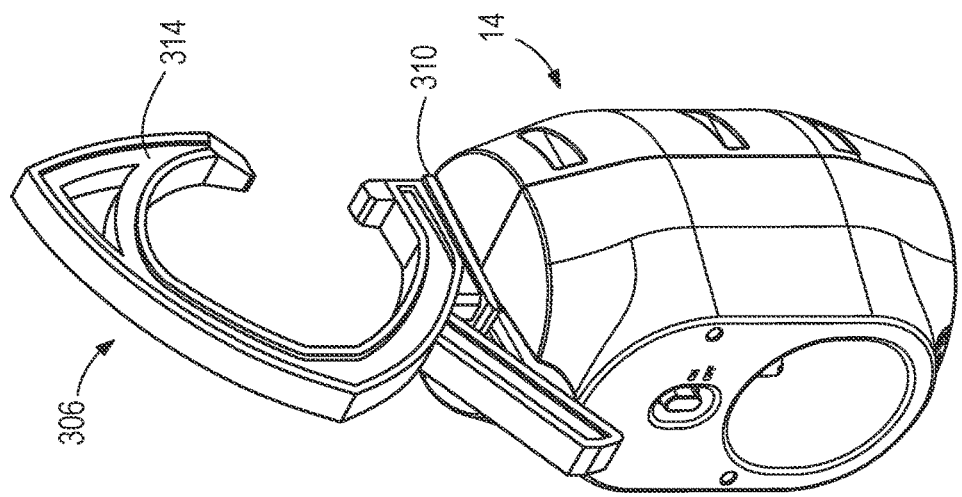
FIGS. 35 and 36 are perspective views of the cabinet and a second hanging device coupled to the keyed region.
Figure 35:
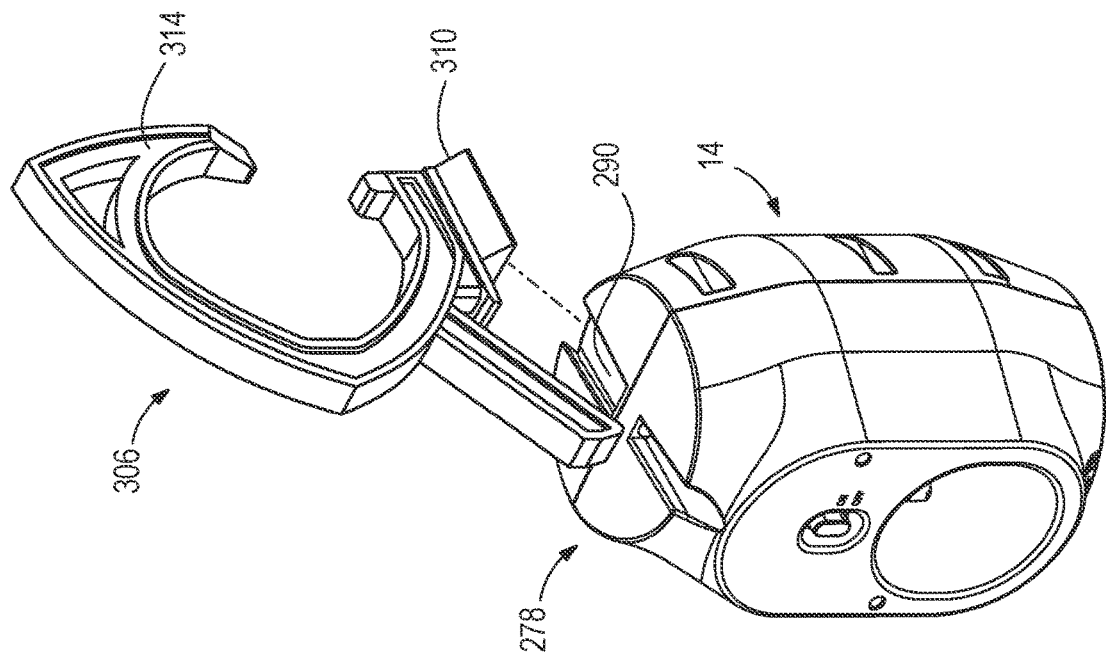

With reference to FIGS. 35 and 36, the puffer device 10 may further include a second hanging device 306 that includes a channel-engaging member 310 that slides into and is secured within one of the channels 290 of the keyed region 278. As illustrated in FIG. 35, the channel-engaging member 310 has generally a dovetail cross-sectional shape that corresponds with the dovetail shape of the channel 290. Thus, when the channel-engaging member 310 has slid into the channel 290, the cabinet 14 is secured to the second hanging device 306 and is vertically supported by the second hanging device 306. In some embodiments the second hanging device 306 further includes a region that passes through the aperture 286, and/or a region that snaps onto the rib 282, to further secure the second hanging device 306 to the cabinet 14. As illustrated in FIGS. 35 and 36, the second hanging device 306 further includes a larger hook region 314 that hooks over a tree branch, pole, or other object, etc., so as to hang the puffer device 10.

Figure 38:
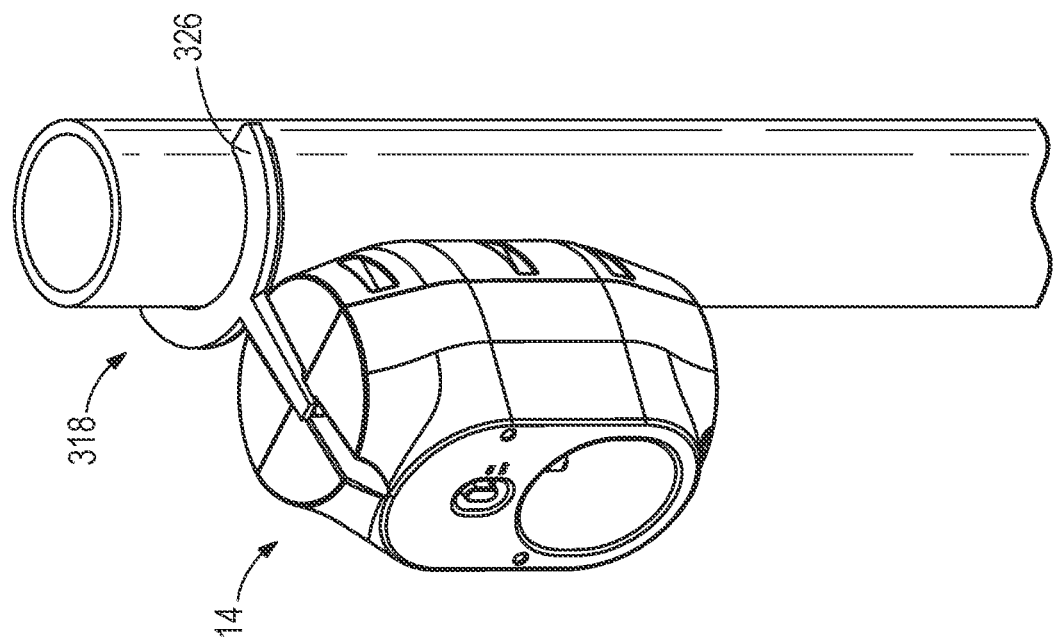
FIGS. 37 and 38 are perspective views of the cabinet and a third hanging device coupled to the keyed region.
Figure 37:
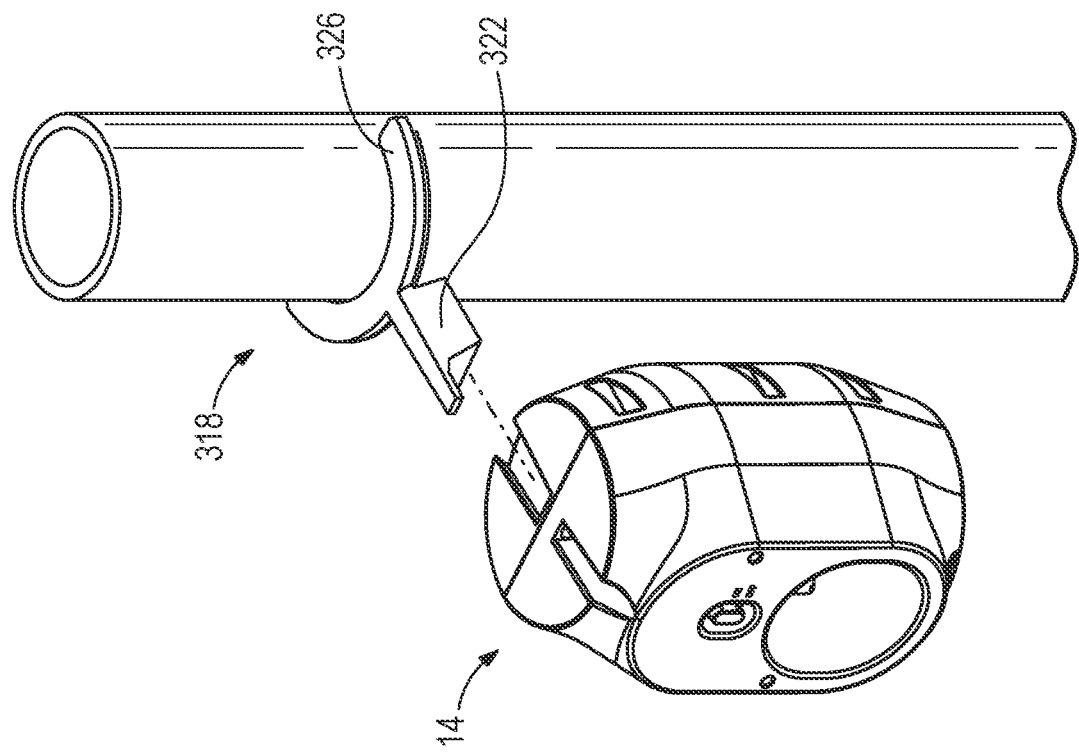

With reference to FIGS. 37 and 38, the puffer device 10 may further include a third hanging device 318 that includes a channel-engaging member 322 that slides into and is secured within one of the channels 290 of the keyed region 278. As illustrated in FIG. 37, the channel-engaging member 322 has a dovetail cross-sectional shape that corresponds with the dovetail shape of the channel 290. Thus, similar to the channel-engaging member 310 described above, when the channel-engaging member 322 has slide into the channel 290, the cabinet 14 is secured to the third hanging device 318 and is vertically supported by the third hanging device 318.

In some embodiments the third hanging device 318 further includes a region that passes through the aperture 286, and/or a region that snaps onto the rib 282, to further secure the third hanging device 318 to the cabinet 14. As illustrated in FIGS. 37 and 38, the third hanging device 318 further includes a ring region 326 that snaps or otherwise engages around a pole 330.

While a particular first, second, and third hanging device 294, 306, 318 have been illustrated (each having a different shape), the puffer device 10 may include various numbers of different hanging devices that all may be coupled to the same keyed region 278 on the cabinet 14. The different hanging devices may have shapes and features other than that illustrated. In yet other embodiments, the cabinet 14 may include more than one keyed region 278. For example, the cabinet 14 may include a first keyed region 278 along a top of the cabinet, and a second keyed region 278 along a side of the cabinet 14. Different hanging devices may be coupled to the various keyed regions. In some embodiments, the keyed region or regions 278 may be used to receive and support devices other than hanging devices.

Although the invention has been described in detail referring to certain preferred embodiments, variations and modifications exist within the scope and spirit of one or more independent aspects of the invention as described.

What is claimed is:

1. A puffer device comprising:
a cabinet having a housing, wherein the housing includes a keyed region along an exterior of the housing;
a hanging device configured to be coupled to the keyed region, wherein the keyed region includes a rib defining an aperture; and
an aerosol can assembly configured to be releasably coupled to the cabinet;
wherein the rib and the aperture are located along a top of the cabinet.

2. The puffer device of claim 1, wherein the rib and the aperture are located centrally along the top of the cabinet.

3. The puffer device of claim 2, wherein the hanging device includes a hook region configured to pass through the aperture.

4. The puffer device of claim 3, wherein the hook region is a first hook region, wherein the hanging device includes a second hook region configured to hook over an object.

5. The puffer device of claim 1, wherein the keyed region includes a channel.

6. The puffer device of claim 5, wherein the channel has a dovetail cross-sectional shape.

7. The puffer device of claim 5, wherein the hanging device includes a channel-engaging member configured to slide into and be secured within the channel.

8. The puffer device of claim 7, wherein the channel has a trapezoidal, dovetail cross-sectional shape, wherein the channel-engaging member has a trapezoidal, dovetail cross-sectional shape that corresponds to the dovetail cross-sectional shape of the channel.

9. The puffer device of claim 7, wherein the hanging device includes a hook region that is separate from the channel-engaging member, wherein the hook region is configured to hook over an object.

10. The puffer device of claim 7, wherein the hanging device includes a ring region that is separate from the channel-engaging member.

11. The puffer device of claim 10, wherein the ring region is sized and shaped such that the ring region is configured to snap onto a pole.

12. The puffer device of claim 1, wherein the hanging device is a first hanging device, wherein the puffer device includes a second, different hanging device that is configured to be coupled to the keyed region.

13. The puffer device of claim 12, wherein the second hanging device has a different shape than the first hanging device.

14. The puffer device of claim 13, wherein at least one of the first hanging device or the second hanging device includes a hook region.

15. The puffer device of claim 13, wherein at least one of the first hanging device or the second hanging device includes a channel-engaging member having a dovetail cross-sectional shape.

16. The puffer device of claim 1, further comprising a printed circuit board and a switch each disposed within the housing, and a gear train assembly coupled to the printed circuit board, the gear train assembly including a motor and a gear driven by the motor, the cabinet further including a plunger driven by the motor, wherein the gear train assembly includes a cam driven by the gear, wherein the cam includes a portion configured to contact the switch.

17. The puffer device of claim 1, wherein the aerosol can assembly includes an aerosol can, an adapter coupled to the aerosol can, and a lock coupled to the adapter, wherein the aerosol can assembly is configured to be releasably coupled to the cabinet by a rotation of the adapter within the cabinet.

18. The puffer device of claim 1, wherein the cabinet includes an upper sealed chamber, and a lower open chamber, wherein the aerosol can assembly is configured to be releasably coupled to the lower open chamber.

19. The puffer device of claim 1, wherein the keyed region is disposed along an upper portion of the cabinet and includes a channel adjacent the rib having a dovetail cross-sectional shape.

20. A puffer device comprising:
a cabinet having a housing, wherein the housing includes a keyed region along an exterior of the housing, wherein the keyed region includes a channel having a dovetail cross-sectional shape;
a hanging device configured to be coupled to the keyed region, wherein the hanging device includes a channel-engaging member configured to slide into and be secured within the channel; and
an aerosol can assembly configured to be releasably coupled to the cabinet;
wherein the cabinet includes an upper sealed chamber, and a lower open chamber, wherein the aerosol can assembly is configured to be releasably coupled to the lower open chamber.

21. A puffer device comprising:
a cabinet having a housing, wherein the housing includes a keyed region along an exterior of the housing;
a first hanging device configured to be coupled to the keyed region;
a second, different hanging device configured to be coupled to the keyed region; and
an aerosol can assembly configured to be releasably coupled to the cabinet;
wherein the cabinet includes an upper sealed chamber, and a lower open chamber, wherein the aerosol can assembly is configured to be releasably coupled to the lower open chamber.

22. A puffer device comprising:
a cabinet having a housing, wherein the housing includes a keyed region along an exterior of the housing, a printed circuit board and a switch each disposed within the housing, and a gear train assembly coupled to the printed circuit board, the gear train assembly including a motor and a gear driven by the motor, the cabinet further including a plunger driven by the motor, wherein the gear train assembly includes a cam driven by the gear, wherein the cam includes a portion configured to contact the switch;
a hanging device configured to be coupled to the keyed region; and
an aerosol can assembly configured to be releasably coupled to the cabinet.

23. A puffer device comprising:
a cabinet having a housing, wherein the housing includes a keyed region along an exterior of the housing;
a hanging device configured to be coupled to the keyed region; and
an aerosol can assembly configured to be releasably coupled to the cabinet, wherein the aerosol can assembly includes an aerosol can, an adapter coupled to the aerosol can, and a lock coupled to the adapter, wherein the aerosol can assembly is configured to be releasably coupled to the cabinet by a rotation of the adapter within the cabinet.

24. A puffer device comprising:
a cabinet having a housing, wherein the housing includes a keyed region along an exterior of the housing, wherein the cabinet includes an upper sealed chamber, and a lower open chamber;
a hanging device configured to be coupled to the keyed region; and
an aerosol can assembly configured to be releasably coupled to the cabinet wherein the aerosol can assembly is configured to be releasably coupled to the lower open chamber.

* * * * *